US012595276B2

(12) United States Patent
Mokhtarzadeh et al.

(10) Patent No.: US 12,595,276 B2
(45) Date of Patent: Apr. 7, 2026

(54) MID-VALENT MOLYBDENUM COMPLEXES FOR THIN FILM DEPOSITION

(71) Applicant: Intel Corporation, Santa Clara, CA (US)

(72) Inventors: Charles Cameron Mokhtarzadeh, Portland, OR (US); Scott B. Clendenning, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 959 days.

(21) Appl. No.: 17/558,795

(22) Filed: Dec. 22, 2021

(65) Prior Publication Data

US 2023/0192735 A1 Jun. 22, 2023

(51) Int. Cl.
| | |
|---|---|
| *H10D 30/67* | (2025.01) |
| *C07F 11/00* | (2006.01) |
| *C07F 17/00* | (2006.01) |
| *C23C 16/18* | (2006.01) |
| *C23C 16/455* | (2006.01) |

(Continued)

(52) U.S. Cl.
CPC ........... *C07F 11/005* (2013.01); *C07F 17/00* (2013.01); *C23C 16/18* (2013.01); *C23C 16/45553* (2013.01); *H10D 30/6739* (2025.01); *H10D 62/83* (2025.01); *H10D 62/85* (2025.01); *H10D 64/62* (2025.01); *H10D 64/667* (2025.01); *H01L 21/28568* (2013.01); *H01L 21/28575* (2013.01); *H01L 21/443* (2013.01); *H10D 30/67* (2025.01); *H10D 84/834* (2025.01); *H10D 84/851* (2025.01)

(58) Field of Classification Search
CPC .......... H10D 30/62–6219; H10D 30/67–6759; H10D 84/832; H10D 84/851
See application file for complete search history.

(56) References Cited

U.S. PATENT DOCUMENTS

| | | | |
|---|---|---|---|
| 2012/0097942 A1* | 4/2012 | Imoto ............... | H01L 21/02554 257/E29.296 |
| 2013/0207079 A1* | 8/2013 | Sleight ................. | H10D 62/119 977/762 |

(Continued)

OTHER PUBLICATIONS

Brown, D., et al., "Amidinate-carboxylate complexes of dimolybdenum and ditungsten: M2(O2CR)2((NiPr)2CR')2. Preparations, molecular and electronic structures and reactions," The Royal Society of Chemistry, Dalton Transactions, pp. 1615-1624 (Published Feb. 22, 2008).

(Continued)

*Primary Examiner* — William B Partridge
*Assistant Examiner* — Alexandre X Ramirez
(74) *Attorney, Agent, or Firm* — Akona IP PC

(57) ABSTRACT

Described herein are IC devices that include molybdenum or a molybdenum compound, such as compounds including oxygen or nitrogen. The molybdenum may be deposited at a high concentration, e.g., at least 50% atomic density. Also described herein are mid-valent molybdenum precursors for depositing molybdenum, and reactions for producing the mid-valent molybdenum precursors. For example, the molybdenum precursors may be generated by reacting a higher-valent molybdenum compound with an amidinate or a formamidinate.

20 Claims, 14 Drawing Sheets

(51) Int. Cl.

| | |
|---|---|
| *H01L 21/285* | (2006.01) |
| *H01L 21/443* | (2006.01) |
| *H10D 62/83* | (2025.01) |
| *H10D 62/85* | (2025.01) |
| *H10D 64/62* | (2025.01) |
| *H10D 64/66* | (2025.01) |
| *H10D 84/83* | (2025.01) |
| *H10D 84/85* | (2025.01) |

(56)     References Cited

U.S. PATENT DOCUMENTS

| | | | |
|---|---|---|---|
| 2022/0093597 A1* | 3/2022 | Ouellette | H10D 84/038 |
| 2023/0019860 A1* | 1/2023 | Ko | H10D 84/832 |

OTHER PUBLICATIONS

Clerac, R., et al., "Dinuclear and Heteropolynuclear Complexes Containing Mo24+ Units," Inorganic Chemistry, vol. 40, No. 3; pp. 420-426 (Published Jan. 8, 2001).

Tsai, Y., et al., "Journey Mo—Mo Quadruple Bonds to Quintuple Bonds," J. Am. Chem. Soc.; vol. 131, No. 35; pp. 12534-12535 (Published Aug. 17, 2009).

Wu, P., et al., "Divergent reactivity of nitric oxide with metal-metal quintuple bonds," Chem. Commun., vol. 49; pp. 4391-4393 (2013).

* cited by examiner

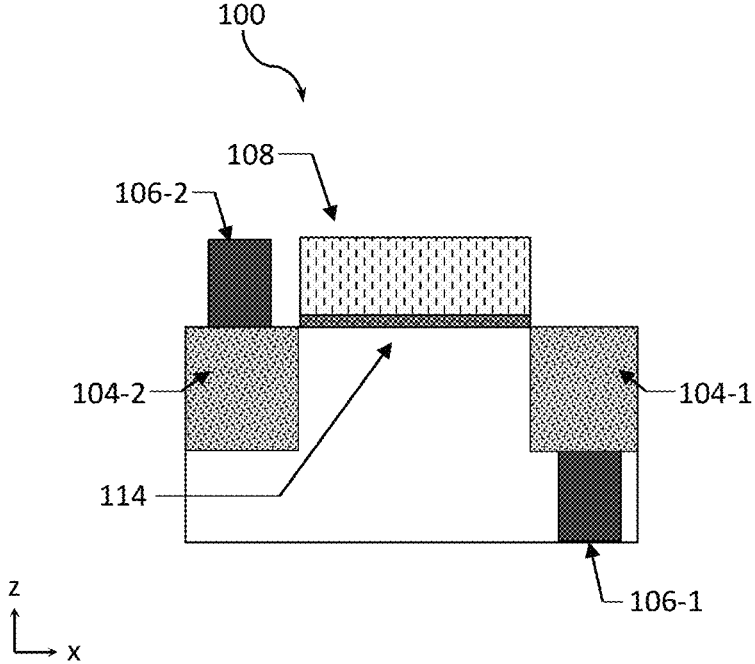
FIG. 1

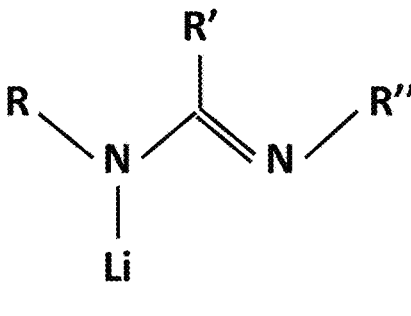
FIG. 3
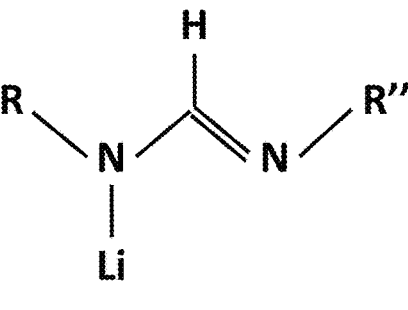
FIG. 4
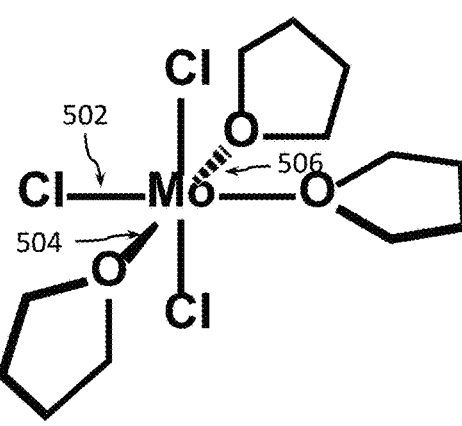
FIG. 5
FIG. 6

MID-VALENT MOLYBDENUM COMPLEXES FOR THIN FILM DEPOSITION

BACKGROUND

With the continued miniaturization of semiconductor devices in accordance with Moore's Law, new gate materials that can be deposited by atomic layer deposition (ALD) at sub-nanometer growth rates are being explored for use in next-generation devices. Molybdenum (Mo) oxides, nitrides, and metallic films have relevance in a variety of gate material applications, including high density of state mid-gap and P-type work function metals, and as p-shifters enabling voltage tuning within the spatial constraints of a gate-all-around transistor architecture. Molybdenum materials may also be used in low resistance contact applications.

The current molybdenum precursor landscape primarily consists of $MoX_{n, n-1}$ and $MoO_2X_{n-2}$ (X=Cl, Br, I; n=6) precursors with Mo in the +5 or +6 oxidation state. These materials are corrosive, and they require a chemical reduction step during processing to access lower-valent $MoO_x$, $Mo_xN_y$, and $Mo^0$ thin films for gate or contact applications. Mo-carbonyl and arene complexes provide Mo in the zero-oxidation state; however, these materials typically exhibit non-self-limiting deposition growth which inhibits use in high aspect ratio features, such as device gates or contacts, due to pinch off near the field of deposition. Additionally, these materials show decreased long term thermal stability, typically due to loss of CO or arene ligands, which leads to undesired side-reactivity and decomposition from reactive unsaturated Mo metal centers.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a schematic illustration of transistor, according to some embodiments of the present disclosure.

FIG. 3 illustrates a chemical structure of an amidinate ligand, according to some embodiments of the present disclosure.

FIG. 4 illustrates a chemical structure of an formamidinate ligand, according to some embodiments of the present disclosure.

FIG. 5 illustrates a chemical structure of an initial molybdenum compound, $MoCl_3(THF)_3$, according to some embodiments of the present disclosure.

FIG. 6 illustrates a chemical structure of a Mo(III) amidinate formed from $MoCl_3(THF)_3$ and an amidinate ligand, according to some embodiments of the present disclosure.

FIGS. 10a and 10b illustrate a lithium aminoamide and an aminoamide derivative formed from the lithium aminoamide and the compound shown in FIG. 8, according to some embodiments of the present disclosure.

FIGS. 11a and 11b illustrate a lithium aminoalkoxide and an aminoalkoxide derivative formed from the lithium aminoalkoxide and the compound shown in FIG. 8, according to some embodiments of the present disclosure.

FIGS. 14a and 14b are schematic illustrations showing processes in the deposition of Mo(II) or Mo(III) on a substrate, according to some embodiments of the present disclosure.

DETAILED DESCRIPTION

Overview

Figure 2:
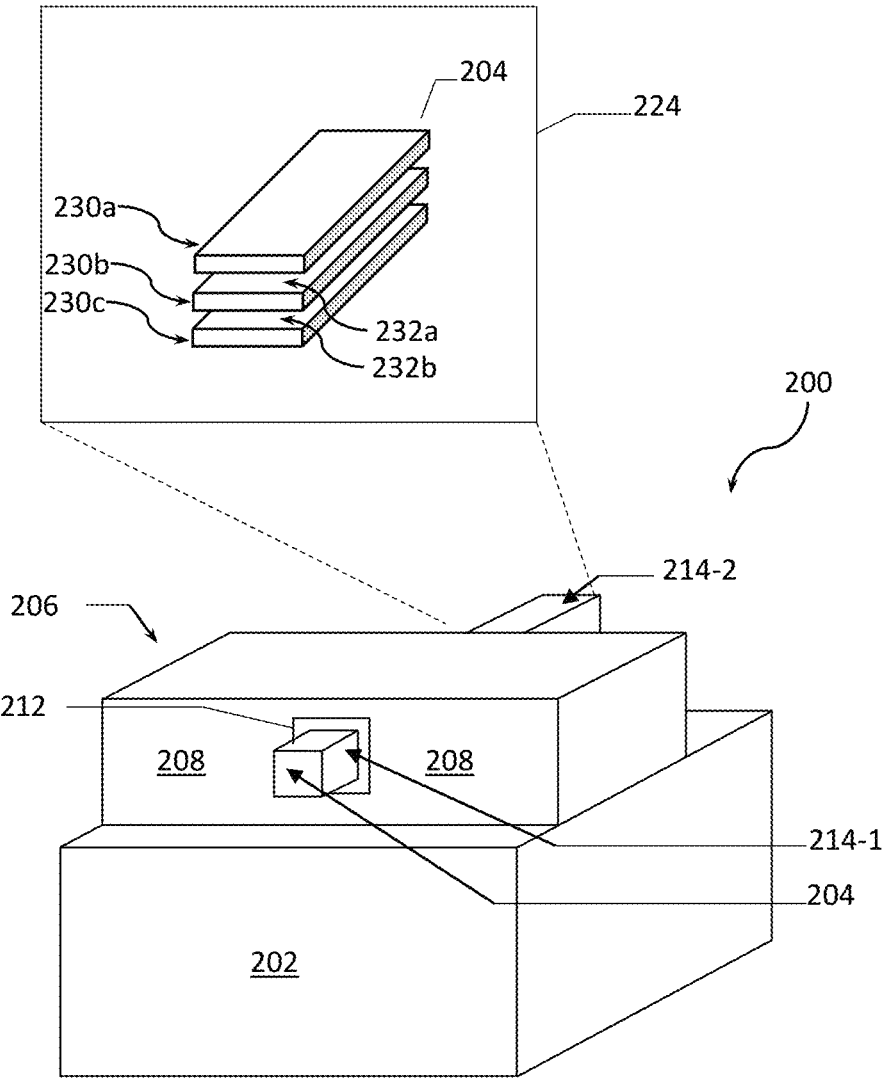
FIG. 2 is a perspective view of an example nanoribbon-based field-effect transistor (FET) transistor, according to some embodiments of the present disclosure.

As noted above, the current molybdenum precursor landscape primarily consists of $MoX_{n, n-1}$ and $MoO_2X_{n-2}$ (X=Cl, Br, I; n=6) precursors with Mo in the +5 or +6 oxidation state. Due to the corrosivity of these materials as well as the need for a chemical reduction step during processing to access lower-valent $MoO_x$ (x=2,3), $Mo_xN_y$ (x=1,2, y=1,2,3), and $Mo^0$ thin films for gate or contact applications, the use of low and mid-valent Mo ALD precursors stands to provide a significant advantage. In particular, lower-valent precursors have a matched reactivity profile to process conditions, which can enable very thin Mo-based thin films. Mid-valent Mo(III) and Mo(II) amidinates show promising volatility profiles capable of being delivered under ALD conditions while offering a lower oxidation state Mo that is capable of generating more highly concentrated and conductive Mo-based thin films.

Several synthetic routes that enable the generation of novel Mo(III) and Mo(II) amidinate precursors for the use as ALD precursors are disclosed herein. Additionally, generation of $Mo_xO_y$, $Mo_xN_y$, and $Mo^0$ thin films using the novel Mo precursors is described herein, and devices that include such thin films, are also described herein. These films have application in a variety of areas of integrated circuit devices, such as p-dipole shifter materials for use in voltage tuning, p-work function metals for multi-threshold voltage devices in the form of $Mo_xN_y$ and $Mo^0$ thin films, and contact materials. Thin films that can be generated from these precursors can be used in various device architectures, including Fin-shaped field-effect transistors (FinFETs), Gate-All-Around (GAA) transistor devices, and nanoribbon transistor devices.

Some embodiments of the present disclosure are based on using semiconductor nanoribbons. As used herein, the term "nanoribbon" refers to an elongated semiconductor structure having a long axis parallel to a support structure (e.g., a substrate, a chip, or a wafer). In some settings, the term "nanoribbon" has been used to describe an elongated semiconductor structure that has a rectangular transverse cross-section (i.e., a cross-section in a plane perpendicular to the longitudinal axis of the structure), while the term "nanowire" has been used to describe a similar structure but with a circular transverse cross-section. In the present disclosure, the term "nanoribbon" is used to describe both such nanoribbons and such nanowires, as well as elongated semiconductor structures with a longitudinal axis parallel to the support structures and with having transverse cross-sections of any geometry (e.g., oval, or a polygon with rounded corners).

The systems, methods and devices of this disclosure each have several innovative aspects, no single one of which is solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. As used herein, a "logic state" (or, alternatively, a "state" or a "bit" value) of a memory cell may refer to one of a finite number of states that the cell can have, e.g., logic states "1" and "0," each state represented by a different voltage of the capacitor of the cell, while "READ" and "WRITE" memory access or operations refer to, respectively, determining/sensing a logic state of a memory cell and programming/setting a logic state of a memory cell. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20% of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For convenience, if a collection of drawings designated with different letters are present, e.g., FIGS. 4A-4B, such a collection may be referred to herein without the letters, e.g., as "FIG. 4."

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices with molybdenum deposited using one of the precursors described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Example Transistor Arrangement

FIG. 1 provides a schematic illustration of a cross-sectional view of an example transistor 100 that may include deposited molybdenum, according to some embodiments of the present disclosure. The transistor 100 may be implemented as either as a stand-alone transistor or included as a part of a memory cell (e.g., the transistor 100 may be an access transistor coupled to a capacitor, forming a one-transistor one-capacitor (1T-1C) memory cell). The transistor 100 may be included in various regions/locations in an IC device. For example, the transistor 100 may be used as, e.g., a logic transistor in a compute logic layer. In another example, the transistor 100 may be used as, e.g., an access transistor in a memory layer.

A number of elements labeled in FIG. 1 are illustrated in these figures with different patterns, with a legend showing the correspondence between the reference numerals and patterns being provided at the bottom of each drawing page containing these figures. For example, the legend illustrates that FIG. 1 uses different patterns to show a channel material 102, S/D regions 104, contacts 106 to S/D regions, a gate electrode 110, and a gate dielectric 112. The view shown in FIG. 1 is intended to show relative arrangements of various elements therein, and various IC devices, or portions thereof, may include other elements or components that are not illustrated (e.g., any further materials, such as e.g. spacer materials that may surround the gate stack of the transistor 100, etch-stop materials, etc.).

In general, a FET, e.g., a metal oxide semiconductor (MOS) FET (MOSFET), is a three-terminal device that includes source, drain, and gate terminals and uses electric field to control current flowing through the device. A FET typically includes a channel material, a source region, and a drain region provided in the channel material, and a gate stack that includes a gate electrode material, alternatively referred to as a "work function" (WF) material, provided over a portion of the channel material between the source and the drain regions, and, optionally, also includes a gate dielectric material between the gate electrode material and the channel material. This general structure is shown in FIG. 1, illustrating a channel material 102, S/D regions 104 (shown as a first S/D region 104-1, e.g., a source region, and a second S/D region 104-2, e.g., a drain region), contacts 106 to S/D regions (shown as a first S/D contact 106-1, providing electrical contact to the first S/D region 104-1, and a second S/D contact 106-2, providing electrical contact to the second S/D region 104-2), and a gate stack 108, which includes at least a gate electrode 110 and may also, optionally, include a gate dielectric 112.

In general, implementations of the present disclosure may be formed or carried out on a support structure, e.g., a support structure under the channel material 102. The support structure (not specifically shown in FIG. 1) may be, e.g., a substrate, a die, a wafer or a chip. For example, the support structure may be the wafer 1500 of FIG. 15A, discussed below, and may be, or be included in, a die, e.g., the singulated die 1502 of FIG. 15B, discussed below. In some embodiments, the support structure may be a substrate that includes silicon and/or hafnium. More generally, the support structure may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (i.e., materials from groups III and V of the periodic system of elements), group II-VI (i.e., materials from groups II and IV of the periodic system of elements), or group IV materials (i.e., materials from group IV of the periodic system of elements). In some embodiments, the substrate may be non-crystalline. In some embodiments, the support structure may be a printed circuit board (PCB) substrate. Although a few examples of materials from which the substrate may be formed are described here, any material that may serve as a foundation upon which a semiconductor device including one or more layers or regions of molybdenum or a molybdenum compound, as described herein, may be built falls within the spirit and scope of the present disclosure.

In some embodiments, the channel material 102 may be composed of semiconductor material systems including, for example, N-type or P-type materials systems. In some embodiments, the channel material 102 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel material 102 may include a combination of semiconductor materials where one semiconductor material may be used for the channel portion (e.g., a portion 114 shown in FIG. 1, which is supposed to refer to the upper-most portion of the channel material 102) and another material, sometimes referred to as a "blocking material," may be used between the channel portion 114 and the support structure over which the transistor 100 is provided. In some embodiments, the channel material 102 may include a monocrystalline semiconductor, such as silicon (Si) or germanium (Ge). In some embodiments, the channel material 102 may include a compound semiconductor with a first sub-lattice of at least one element from group III of the periodic table (e.g., Al, Ga, In), and a second sub-lattice of at least one element of group V of the periodic table (e.g., P, As, Sb).

For some example N-type transistor embodiments (i.e., for the embodiments where the transistor 100 is an NMOS), the channel portion 114 of the channel material 102 may advantageously include a III-V material having a high electron mobility, such as, but not limited to InGaAs, InP, InSb, and InAs. For some such embodiments, the channel portion 114 of the channel material 102 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion 114 of the channel material 102 may be an intrinsic III-V material, i.e., a III-V semiconductor material not intentionally doped with any electrically active impurity. In alternate embodiments, a nominal impurity dopant level may be present within the channel portion 114 of the channel material 102, for example to further fine-tune a threshold voltage Vt, or to provide HALO pocket implants, etc. Even for impurity-doped embodiments however, impurity dopant level within the channel portion 114 of the channel material 602 may be relatively low, for example below $10^{15}$ dopant atoms per cubic centimeter ($cm^{-3}$), and advantageously below $10^{13}$ $cm^{-3}$.

For some example P-type transistor embodiments (i.e., for the embodiments where the transistor 100 is a PMOS), the channel portion 114 of the channel material 102 may advantageously be a group IV material having a high hole mobility, such as, but not limited to Ge or a Ge-rich SiGe alloy. For some example embodiments, the channel portion 114 of the channel material 102 may have a Ge content between 0.6 and 0.9, and advantageously may be at least 0.7. In some embodiments with highest mobility, the channel portion 114 may be intrinsic III-V (or IV for P-type devices) material and not intentionally doped with any electrically active impurity. In alternate embodiments, one or more a nominal impurity dopant level may be present within the channel portion 114, for example to further set a threshold voltage (Vt), or to provide HALO pocket implants, etc. Even for impurity-doped embodiments however, impurity dopant level within the channel portion is relatively low, for example below $10^{15}$ $cm^{-3}$, and advantageously below $10^{13}$ $cm^{-3}$.

In some embodiments, the transistor 100 may be a thin film transistor (TFT). A TFT is a special kind of a field-effect transistor made by depositing a thin film of an active semiconductor material, as well as a dielectric layer and metallic contacts, over a supporting layer that may be a non-conducting layer. At least a portion of the active semiconductor material forms a channel of the TFT. If the transistor 100 is a TFT, the channel material 102 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, if the transistor 100 is a TFT, the channel material 102 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In some embodiments, the channel material 102 may have a thickness between about 5 and 75 nanometers, including all values and ranges therein. In some embodiments, a thin film channel material 102 may be deposited at relatively low temperatures, which allows depositing the channel material 102 within the thermal budgets imposed on back end fabrication to avoid damaging other components, e.g., front end components such as the logic devices.

As shown in FIG. 1, a first and a second S/D region 104-1, 104-2 (together referred to as "S/D regions 104") may be included on either side of the gate stack 108, thus realizing a transistor. As is known in the art, source and drain regions (also sometimes interchangeably referred to as "diffusion regions") are formed for the gate stack of a FET. In some embodiments, the S/D regions 104 of the transistor 100 may be regions of doped semiconductors, e.g. regions of the channel material 102 (e.g., of the channel portion 114) are doped with a suitable dopant to a suitable dopant concentration, so as to supply charge carriers for the transistor channel. In some embodiments, the S/D regions 104 may be highly doped, e.g. with dopant concentrations of about $1·10^{21}$ $cm^{-3}$, in order to advantageously form Ohmic contacts with the respective S/D contacts 106, although, in other embodiments, these regions may also have lower dopant concentrations and may form Schottky contacts in some implementations. Irrespective of the exact doping levels, the S/D regions 104 of the transistor 100 may be the regions having dopant concentration higher than in other regions, e.g. higher than a dopant concentration in a region of the channel material 102 between the first S/D region 104-1 and the second S/D region 104-2, and, therefore, may be referred to as "highly doped" (HD) regions. In some embodiments, the S/D regions 104 may generally be formed using either an implantation/diffusion process or an etching/deposition process. In the former process, dopants such as boron, aluminum, antimony, phosphorous, or arsenic may be ion-implanted into the one or more semiconductor materials of the upper portion of the channel material 102 to form the S/D regions 104. An annealing process that activates the dopants and causes them to diffuse further into the channel material 102 may follow the ion implantation process. In the latter process, the one or more semiconductor materials of the channel material 102 may first be etched to form recesses at the locations for the future S/D regions. An epitaxial deposition process may then be carried out to fill the recesses with material (which may include a combination of different materials) that is used to fabricate the S/D regions 104. In some implementations, the S/D regions 104 may be fabricated using a silicon alloy such as silicon germanium or silicon carbide. In some implementations, the epitaxially deposited silicon alloy may be doped in situ with dopants such as boron, arsenic, or phosphorous. In further embodiments, the S/D regions 104 may be formed using one or more alternate semiconductor materials such as germanium or a group III-V material or alloy. Although FIG. 1 illustrates the first and second S/D regions 104 with a single pattern, suggesting that the material composition of the first and second S/D regions 104 is the same, this may not be the case in some other embodiments of the transistor 100. Thus, in some embodiments, the material composition of the first S/D region 104-1 may be different from the material composition of the second S/D region 104-2.

As further shown in FIG. 1, S/D contacts 106-1 and 106-2 (together referred to as "S/D contacts 106"), which are formed of one or more electrically conductive materials, may be used for providing electrical connectivity to the S/D regions 104-1 and 104-2, respectively. In various embodiments, one or more layers of metal and/or metal alloys may be used to form the S/D contacts 106. In particular, one or both of the S/D contacts 106-1 and 106-2 may include molybdenum (Mo$^0$) or a molybdenum compound, e.g., Mo$_x$N$_y$or Mo$_x$O$_y$, e.g., as a molybdenum layer or as the full contact 106.

An S/D contact 106, or a portion of an S/D contact 106 (e.g., a molybdenum layer of the S/D contact), may have an atomic density of molybdenum of at least 50%, i.e., at least half of the atoms in the Mo layer or portion are molybdenum. In other examples, a molybdenum layer may have at least a 60% atomic density of molybdenum, at least a 70% atomic density of molybdenum, at least an 80% atomic density of molybdenum, at least a 90% atomic density of molybdenum, or another value.

In other examples, the electrically conductive materials of the S/D contacts 106 may include one or more metals or metal alloys, with materials such as copper, ruthenium, palladium, platinum, cobalt, nickel, hafnium, zirconium, titanium, tantalum, and aluminum, tantalum nitride, tungsten, doped silicon, doped germanium, or alloys and mixtures of any of these. In some embodiments, the S/D contacts 106 may include one or more electrically conductive alloys, oxides, or carbides of one or more metals. In some embodiments, the S/D contacts 106 may include a doped semiconductor, such as silicon or another semiconductor doped with an N-type dopant or a P-type dopant. Metals may provide higher conductivity, while doped semiconductors may be easier to pattern during fabrication. Although FIG. 1 illustrates the first and second S/D contacts 106 with a single pattern, suggesting that the material composition of the first and second S/D contacts 106 is the same, this may not be the case in some other embodiments of the transistor 100. Thus, in some embodiments, the material composition of the first S/D contact 106-1 may be different from the material composition of the second S/D contact 106-2.

Turning to the gate stack 108, the gate electrode 110 may include at least one P-type work function metal or N-type work function metal, depending on whether the transistor 100 is a P-type metal oxide semiconductor (PMOS) transistor or an N-type metal oxide semiconductor (NMOS) transistor. For a PMOS transistor, metals that may be used for the gate electrode 110 may include, but are not limited to, ruthenium, palladium, platinum, cobalt, nickel, and conductive metal oxides (e.g., ruthenium oxide). For an NMOS transistor, metals that may be used for the gate electrode 110 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode 110 may include a stack of two or more metal layers, where one or more metal layers are WF metal layers and at least one metal layer is a fill metal layer.

In some embodiments, the gate electrode 110 may include molybdenum (Mo$^0$) or a molybdenum compound, e.g., Mo$_x$N$_y$ or Mo$_x$O$_y$. A molybdenum layer forming the gate electrode 110 may have an atomic density of molybdenum of at least 50%, i.e., at least half of the atoms in the gate electrode 110 or a portion of the gate electrode 110 are molybdenum. In other examples, a molybdenum layer forming the gate electrode 110 may have at least a 60% atomic density of molybdenum, at least a 70% atomic density of molybdenum, at least an 80% atomic density of molybdenum, at least a 90% atomic density of molybdenum, or another value.

If used, the gate dielectric 112 may at least laterally surround the channel portion 114, and the gate electrode 110 may laterally surround the gate dielectric 112 such that the gate dielectric 112 is disposed between the gate electrode 110 and the channel material 104. In various embodiments, the gate dielectric 112 may include one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric 112 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric 112 during manufacture of the transistor 600 to improve the quality of the gate dielectric 112. In some embodiments, the gate dielectric 112 may have a thickness between about 0.5 nanometers and 3 nanometers, including all values and ranges therein, e.g., between about 1 and 3 nanometers, or between about 1 and 2 nanometers.

In some embodiments, the gate stack 108 may be surrounded by a dielectric spacer, not specifically shown in FIG. 1. The dielectric spacer may be configured to provide separation between the gate stacks 108 of different transistors 100 which may be provided adjacent to one another (e.g., different transistors 100 provided along a single fin if the transistors 100 are FinFETs), as well as between the gate stack 108 and one of the S/D contacts 106 that is disposed on the same side as the gate stack 108. Such a dielectric spacer may include one or more low-k dielectric materials. Examples of the low-k dielectric materials that may be used as the dielectric spacer include, but are not limited to, silicon dioxide, carbon-doped oxide, silicon nitride, fused silica glass (FSG), and organosilicates such as silsesquioxane, siloxane, and organosilicate glass. Other examples of low-k dielectric materials that may be used as the dielectric spacer include organic polymers such as polyimide, polynorbornenes, benzocyclobutene, perfluorocyclobutane, or polytetrafluoroethylene (PTFE). Still other examples of low-k dielectric materials that may be used as the dielectric spacer include silicon-based polymeric dielectrics such as hydrogen silsesquioxane (HSQ) and methylsilsesquioxane (MSQ). Other examples of low-k materials that may be used in a dielectric spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

As shown in FIG. 1, the second S/D contact 106-2 is provided on the same side as the gate stack 108, which may be considered to be the front side of the transistor 100, while the first S/D contact 106-1 is provided on the opposite side, which may be considered to be the back side of the transistor 100. Thus, the first S/D contact 106-1 is the back-side contact and the second S/D contact 106-2 is the front-side contact of the transistor 100. In other embodiments, both S/D contacts 106 may be provided on a single side of a transistor, e.g., on the front side (where the gate stack 108 is provided) or on the back side. Further, while the gate stack 108 is provided on the front side in FIG. 1, alternatively, the gate stack 108 may be provided on the back side.

Transistors may be implemented using any suitable transistor architecture, e.g. planar or non-planar architectures. One example non-planar structure is provided in FIG. 2, which illustrates a nanoribbon-based transistor. Alternatively, a transistor may be implemented as a FinFET or another non-planar architecture.

Example Nanoribbon-Based Transistor

As noted above, one example transistor architecture is a nanoribbon-based transistor (or, simply, a nanoribbon transistor, e.g., a nanowire transistor). In a nanoribbon transistor, a gate stack that may include a stack of one or more gate electrode metals and, optionally, a stack of one or more gate dielectrics may be provided around a portion of an elongated semiconductor structure called "nanoribbon", forming a gate on all sides of the nanoribbon. The portion of the nanoribbon around which the gate stack wraps around is referred to as a "channel" or a "channel portion." A semiconductor material of which the channel portion of the nanoribbon is formed is commonly referred to as a "channel material." A source region and a drain region are provided on the opposite ends of the nanoribbon, on either side of the gate stack, forming, respectively, a source and a drain of such a transistor. Wrap-around or all-around gate transistors, such as nanoribbon and nanowire transistors, may provide advantages compared to other transistors having a non-planar architecture, such as FinFETs.

FIG. 2 is a perspective view of a nanoribbon transistor 200 that may include deposited molybdenum, according to some embodiments of the present disclosure. The transistor 200 may be implemented as either as a stand-alone transistor or included as a part of a memory cell (e.g., the transistor 200 may be an access transistor coupled to a capacitor, forming a 1T-1C memory cell). The transistor 200 may be included in various regions/locations in an IC device. For example, the transistor 200 may be used as, e.g., a logic transistor in a compute logic layer. In another example, the transistor 200 may be used as, e.g., an access transistor in a memory layer.

The arrangement shown in FIG. 2 is intended to show relative arrangements of some of the components therein, and that the arrangement with the transistor 200, or portions thereof, may include other components that are not illustrated (e.g., electrical contacts to the source and the drain of the transistor 200, additional layers such as a spacer layer, around the gate electrode of the transistor 210, etc.). For example, although not specifically illustrated in FIG. 2, a dielectric spacer may be provided between the source electrode and the gate stack as well as between the transistor drain electrode and the gate stack of the all-around-gate transistor 200 in order to provide electrical isolation between the source, gate, drain electrodes. In another example, although not specifically illustrated in FIG. 2, at least portions of the transistor 200 may be surrounded in an insulator material, such as any suitable interlayer dielectric (ILD) material. In some embodiments, such an insulator material may be a high-k dielectric, such as any of the high-k materials provided with respect to FIG. 1. In other embodiments, the insulator material surrounding portions of the transistor 200 may be a low-k dielectric material, e.g., any of the low-k materials provided with respect to FIG. 1.

Turning to the details of FIG. 2, the transistor 200 may include a channel material formed as a nanoribbon 204 made of one or more semiconductor materials, the nanoribbon 204 provided over a base 202, e.g., a support structure as described above with respect to FIG. 1. In some embodiments, a layer of oxide material (not specifically shown in FIG. 2) may be provided between the base 202 and the gate electrode 208.

The nanoribbon 204 may take the form of a nanowire or nanoribbon, for example. Although the nanoribbon 204 illustrated in FIG. 2 is shown as having a square cross-section, the nanoribbon 204 may instead have a cross-section that is rectangular but not square, a cross-section that is rounded at corners or otherwise irregularly shaped, and the gate stack 206 may conform to the shape of the nanoribbon 204. In use, the all-around-gate transistor may form conducting channels on more than three "sides" of the nanoribbon 204, potentially improving performance relative to FinFETs. Furthermore, although FIG. 2 depicts an embodiment in which the longitudinal axis of the nanoribbon 204 runs substantially parallel to a plane of the base 202, this need not be the case; in other embodiments, the nanoribbon 204 may be oriented, e.g., "vertically" so as to be perpendicular to a plane of the base 202.

While the nanoribbon 204 illustrated within the transistor 200 is depicted as a solid nanoribbon with a square cross-section, the zoom region 224 shows another example implementation of the nanoribbon 204. In this example, the nanoribbon 204 includes three thinner nanoribbon components 230a, 230b, and 230c stacked on top of each other, with spaces 232a and 232b between adjacent nanoribbon components 230 (e.g., the space 232a is between the nanoribbon components 230a and 230b). While three nanoribbon components 230 and two gaps 232 are shown in the zoom region 224, more or fewer nanoribbon components 230 and corresponding gaps may be included. A dielectric material 212 (if used) and the gate electrode material 208 may fill the spaces 232 between adjacent nanoribbon components 230. The spaces 232 between the nanoribbon components 230 can be quite small, e.g., between 5 and 20 nanometers, or in some examples, between 7 and 10 nanometers. If a low-density gate electrode material (e.g., a gate electrode material in which the conductive component, such as $Mo^0$, has an atomic density of less than 50% or less than 40%) is used, the material forming the gate electrode 208 within the spaces 232 may not be sufficiently conductive. The molybdenum precursors disclosed herein can be used to deposit molybdenum for the gate electrode 208 that can wrap around the nanoribbon components 230, including within the spaces 232, with sufficient density, e.g., at least 50% atomic density of molybdenum.

In some embodiments, the channel material of the nanoribbon 204 may be composed of semiconductor material systems including, for example, N-type or P-type materials systems. For example, the materials discussed above with respect to the channel material 102 shown in FIG. 1 may be used to form the nanoribbon 204.

A gate stack 206 including a gate electrode material 208 and, optionally, a gate dielectric material 212, may wrap entirely or almost entirely around a portion of the nanoribbon 204, or around the nanoribbon components 230, with the active region of the channel material of the nanoribbon 204 corresponding to the portion of the nanoribbon 204 wrapped by the gate stack 206. For example, the gate dielectric material 212 may wrap around a transversal portion of the nanoribbon 204 and the gate electrode material 208 may wrap around the gate dielectric material 212. In some embodiments, the gate stack 206 may fully encircle the nanoribbon 204 or nanoribbon components 230.

The gate electrode material 208 may include at least one P-type work function metal or N-type work function metal, e.g., the materials described with respect to the gate electrode 110. In some embodiments, the gate electrode 208 may include molybdenum ($Mo^0$) or a molybdenum compound, e.g., $Mo_xN_y$, or $Mo_xO_y$. A molybdenum layer forming the gate electrode 208 may have an atomic density of molybdenum of at least 50%, i.e., at least half of the atoms in the gate electrode 208 or a portion of the gate electrode 208 are molybdenum. In other examples, a molybdenum layer forming the gate electrode 208 may have at least a 60% atomic density of molybdenum, at least a 70% atomic density of molybdenum, at least an 80% atomic density of molybdenum, at least a 90% atomic density of molybdenum, or another value.

In some embodiments, the gate dielectric material 212 may include one or more high-k dielectrics including any of the materials discussed above with respect to the gate dielectric 112. In some embodiments, the gate stack 206 may be surrounded by a gate spacer, not shown in FIG. 2. Such a gate spacer would be configured to provide separation between the gate stack 206 and source/drain contacts of the transistor 200 and could be made of a low-k dielectric material, some examples of which have been provided above. A gate spacer may include pores or air gaps to further reduce its dielectric constant.

As further shown in FIG. 2, the nanoribbon 204 may include a source region and a drain region on either side of the gate stack 206, thus realizing a transistor. As is well known in the art, source and drain regions are formed for the gate stack of each MOS transistor. As described above, the source and drain regions of a transistor are interchangeable, and a nomenclature of a first S/D region and a second S/D region of an access transistor has been introduced for use in the present disclosure. In FIG. 2, reference numeral 214-1 is used to label the first S/D region and reference numeral 214-2 is used to label the second S/D region.

In some embodiments, the transistor 200 may have a gate length (i.e., a distance between the first and second S/D regions 214), a dimension measured along the nanoribbon 204, between about 5 and 40 nanometers, including all values and ranges therein (e.g., between about 22 and 35 nanometers, or between about 20 and 30 nanometers). In some embodiments, an area of a transversal cross-section of the nanoribbon 204 may be between about 25 and 10000 square nanometers, including all values and ranges therein (e.g., between about 25 and 1000 square nanometers, or between about 25 and 500 nanometers).

The S/D regions 214 may be coupled to first and second S/D contacts, not specifically shown in FIG. 2. The S/D contacts may be similar to the S/D contacts 106 described with respect to FIG. 1, and may be formed on any side or along multiple sides of the S/D regions 214. Similar materials to those discussed above with respect to the S/D regions 106 may be used.

For example, one or both of the S/D contacts may include molybdenum ($Mo^0$) or a molybdenum compound, e.g., $Mo_xN_y$,or $Mo_xO_y$, e.g., as a molybdenum layer or as the full contact. An S/D contact, or a portion of an S/D contact (e.g., a molybdenum layer of the S/D contact), may have an atomic density of molybdenum of at least 50%, i.e., at least half of the atoms in the Mo layer or portion are molybdenum. In other examples, a molybdenum layer may have at least a 60% atomic density of molybdenum, at least a 70% atomic density of molybdenum, at least an 80% atomic density of molybdenum, at least a 90% atomic density of molybdenum, or another value.

Example Ligands for Forming Mid-Valent Molybdenum Precursors

The molybdenum precursors disclosed herein may be formed using one of two ligand structures, illustrated in FIGS. 3 and 4. FIG. 3 illustrates a chemical structure of an amidinate ligand, and FIG. 4 illustrates a chemical structure of an formamidinate ligand. These ligands can provide access to volatile materials. For example, by modulating the ligands' R groups and inducing asymmetry into the ligand architecture, the volatility of the ligand and subsequent metal precursors can be tuned to meet the desired process conditions.

Turning to FIG. 3, the amidinate ligand has two nitrogen atoms, a lithium atom, one group referred to as R, one group referred to as R', and one group referred to as R", with these components arranged as illustrated in FIG. 3. Each of the R, R', and R" groups may be a methyl group (Me), an ethyl group (Et), an isopropyl group (iPr), or a tert-butyl group (tBu). In some embodiments, the R and R" groups are the same, but in other embodiments the R and R" are different, e.g., to engender additional degrees of asymmetry. The R' group may be different from the R group and/or the R" group. For example, both of the R and R" groups may be Me, while the R' group is Et.

Turning to FIG. 4, the formamidinate ligand has two nitrogen atoms, one lithium atom, one hydrogen atom, and two R groups (R and R"), with these components arranged as illustrated in FIG. 4. The hydrogen atom replaces the R' group in the amidinate ligand. The R and R" groups may be Me groups, Et groups, iPr groups, or tBu groups, and are typically the same but can also be modulated to incorporate different R groups to engender additional degrees of asymmetry. For example, both the R group and R" groups may be iPr.

Example Initial Mo Compound for Producing a Mid-Valent Molybdenum Precursor

FIG. 5 illustrates a chemical structure of an initial molybdenum compound, $MoCl_3(THF)_3$, according to some embodiments of the present disclosure. $MoCl_3(THF)_3$ includes one Mo atom, three chlorine (Cl) atoms, and three tetrahydrofuran (THF) groups, each of which includes an oxygen (O) atom in combination with carbon and hydrogen. The Mo atom in $MoCl_3(THF)_3$ is in the 3+ oxidation state. $MoCl_3(THF)_3$ can be reacted in solution with either the amidinate or formamidiante ligand via a salt elimination route to form a Mo compound in the 3+ oxidation state.

Different bond styles are used to represent the three-dimensional structure of the compound shown in FIG. 5, and other chemical compounds illustrated in the figures. Straight bonds, e.g., the bond 502, represents a bond within the plane of the page. Solid tapered bonds, e.g., the bond 504, represent bonds extending out of the page, so that the atom bonded to the central atom (for the bond 504, the O atom bonded to the Mo atom) is located further out of the page than the central atom. Dashed tapered bonds, e.g., the bond 506, represent bonds extending into the page, so that the atom bonded to the central atom (for the bond 506, the O atom bonded to the Mo atom) is located behind the page relative to the central atom.

Example Homoleptic Mo(III) Amidinate Molybdenum Precursors

FIG. 6 illustrates a chemical structure of a Mo(III) amidinate formed from $MoCl_3(THF)_3$ shown in FIG. 5 and the amidinate ligand shown in FIG. 3, according to some embodiments of the present disclosure. The $MoCl_3(THF)_3$ can be reacted in a solution with an amidinate ligand to generate a Mo(III) amidinate, in which the Mo atom is in a +3 oxidation state. The $MoCl_3(THF)_3$ is combined with an amidinate at a 3:1 ratio (3 amidinate to 1 $MoCl_3(THF)_3$). The $MoCl_3(THF)_3$ and the amidinate may react over a period of time, e.g., 24 hours, in a solution of diethyl ether ($Et_2O$) and THF. The $Et_2O$ and THF may have a 5:1 ratio (5 $Et_2O$ to 1 THF). The reaction produces the Mo compound shown in FIG. 6 and lithium chloride (LiCl) in a 3:1 ratio (3 LiCl to 1 $MoCl_3(THF)_3$). The LiCl may be removed from the solution to isolate the mid-valent Mo(III) amidinate via filtration over celite and further purified by recrystalization.

As illustrated in FIG. 6, the Mo(III) amidinate includes one Mo atom, which has a +3 oxidation state. The Mo(III) amidinate further includes six nitrogen atoms bonded to the Mo atom, and various R and R' groups bonded to the nitrogen atoms as illustrated in FIG. 6. The R and R' groups may be the same as the R and R' groups discussed with respect to the amidinate ligand. In particular, each of the R and R' groups may be a Me, Et, iPr, or tBu, with the R groups (in some cases) being the same, and the R' groups being the same. As noted with respect to FIG. 3, in some embodiments, the two R groups in each amidinate ligand are different, i.e., as represented by the R and R" groups in FIG. 3. The R and R' groups present in the Mo(III) amidinate depend on which R and R' groups are included in the initial amidinate that reacted with the $MoCl_3(THF)_3$. In some embodiments, the R' group may be a hydrogen atom, e.g., a formamidiante is used instead of an amidinate.

The Mo(III) amidinate shown in FIG. 6 may be used as a Mo precursor for depositing Mo on an IC device, e.g., as a gate electrode and/or as a S/D contact (or pair of S/D contacts) for either of the transistor structures shown in FIGS. 1 and 2. A method for depositing the Mo(III) amidinate is described with respect to FIGS. 13 and 14.

Example Mo(II) Dimeric Amidinates and Amidinate/Acetate Complexes for Molybdenum Precursors FIGS. 7a-7e illustrate various chemical structures of Mo(II) dimeric amidinates or mixed amidinate/acetates formed from $Mo_2(OAc)_4$ and an amidinate ligand, according to some embodiments of the present disclosure. An alternate initial Mo compound, $Mo_2(Oac)_4$, can be reacted in a solution with an amidinate ligand to generate a Mo(II) amidinate, in which the Mo atom is in a +2 oxidation state. Compared to the Mo(III) amidinate shown in FIG. 6, the Mo(II) compounds shown in FIGS. 7a-7e are a more atom-economical source of Mo, as each compound includes two Mo atoms. The ability to deliver an additional metal atom allows for a much more diverse control of thin film stoichiometry, especially in the generation of metal rich $MoO_x$ and $Mo_xN_y$ films under gentler deposition conditions (e.g., lower substrate temperatures) than previous Mo precursors found in industrial use.

Figures 7A, 7B, 7C, 7D, 7E:
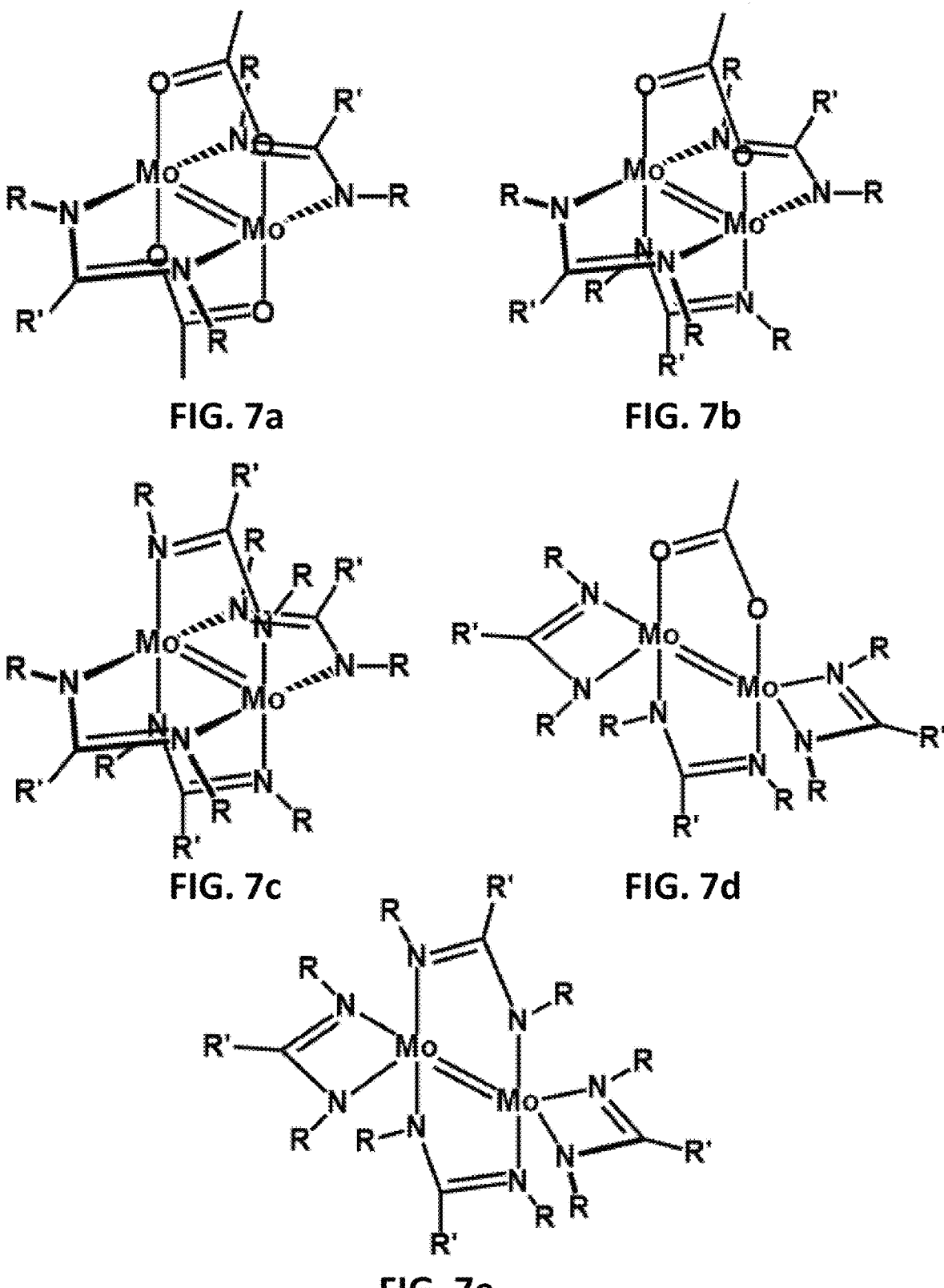
FIGS. 7a-7e illustrate various chemical structures of a Mo(II) dimeric amidinate formed from $Mo_2(OAc)_4$ and an amidinate ligand, according to some embodiments of the present disclosure.

Each of the Mo(II) compounds illustrated in FIGS. 7a-7e includes two Mo atoms, which each have a +2 oxidation state. The two Mo atoms are bonded together. The Mo(II) compound illustrated in FIG. 7a has two nitrogen atoms and two oxygen atoms bonded to each of the Mo atoms. The Mo(II) compounds illustrated in FIGS. 7b and 7d each have three nitrogen atoms and one oxygen atom bonded to each of the Mo atoms, but the structures of FIGS. 7b and 7d are different. The Mo(II) compounds illustrated in FIGS. 7c and 7e each have four nitrogen atoms bonded to each of the Mo atoms, but the structures of FIGS. 7c and 7e are different.

Each of the Mo(II) compounds illustrated in FIGS. 7a-7e include various R and R' groups bonded to their nitrogen atoms. The R and R' groups may be the same as the R and R' groups discussed with respect to the amidinate ligand, but can also be modulated to incorporate different R groups to engender additional degrees of asymmetry. For example, some R groups may be replaced with R" groups, if the amidinate ligand includes R" groups that are different from the R groups (as discussed above with respect to FIG. 3). Each of the R and R' groups may be a Me, Et, iPr, a sec-butyl group (secBu), or tBu, with the R groups (in some cases) being the same, and the R' groups being the same. The R and R' groups present in the Mo(II) compounds depend on which R and R' groups are included in the initial amidinate that reacted with the $Mo_2(OAc)_4$. Furthermore, the selection of the R and R' groups (i.e., the type of amidinate reacted with the $Mo_2(OAc)_4$) determines which of the Mo(II) compound structures shown in FIGS. 7a-7e is produced. For example, more sterically encumbering ligands (i.e., the larger ligands) may lead to the structures shown in FIGS. 7a and 7d. Smaller ligands may lead to the structures shown in FIGS. 7b and 7c.

The Mo(II) compounds shown in FIGS. 7a-7c may be used as a Mo precursor for depositing Mo on an IC device, e.g., as a gate electrode and/or as a S/D contact (or pair of S/D contacts) for either of the transistor structures shown in FIGS. 1 and 2. A method for depositing the Mo(III) amidinate is described with respect to FIGS. 13 and 14.

Two-Step Process for Forming Heteroleptic Mo(III) Amidinates and Formamidinate Complexes for Molybdenum Precursors In addition to the Mo(III) and Mo(II) complexes shown in FIGS. 6 and 7, various monomeric 6-coordinate heteroleptic Mo(III) precursors of the form Mo(AMD)2(L) and Mo(AMD)(L)2, where L is a monoanionic ligand such as cyclopentadienide, diazabutadiene, aminoamide, or aminoalkoxide, can be used as Mo precursors for forming Mo-based films in IC devices. Each of these Mo(III) precursors may be obtained using a two-step process, starting with the molybdenum compound, $MoCl_3(THF)_3$, shown in FIG. 5. After an initial reaction of $MoCl_3(THF)_3$ with an amidinate ligand to obtain the compound illustrated in FIG. 8, a second reaction can be performed to provide different Mo(III) compounds, e.g., the compounds shown in FIG. 9, 10b, 11b, or 12b.

Figures 8, 9:
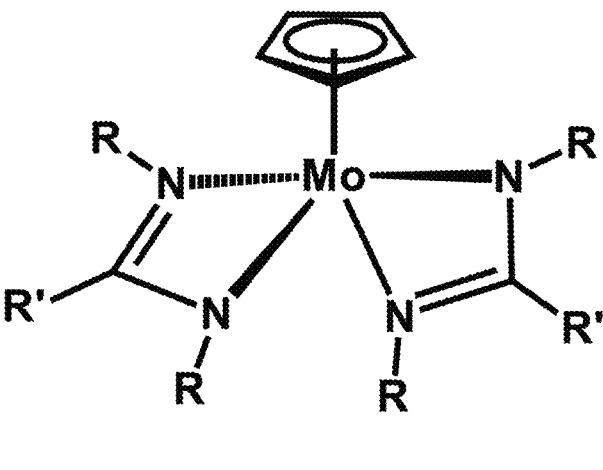
FIG. 8 illustrates an intermediate molybdenum compound formed from $MoCl_3(THF)_3$ and an amidinate ligand, according to some embodiments of the present disclosure.
FIG. 9 illustrates a cyclopenadienyl derivative formed from the compound shown in FIG. 8, according to some embodiments of the present disclosure.

FIG. 8 illustrates an intermediate molybdenum compound formed from $MoCl_3(THF)_3$ and the amidinate ligand, according to some embodiments of the present disclosure. The $MoCl_3(THF)_3$ may be reacted in a solution with an amidinate ligand to generate the intermediate Mo compound shown in FIG. 8. The $MoCl_3(THF)_3$ is combined with an amidinate at a 2:1 ratio (2 amidinate to 1 $MoCl_3(THF)_3$). The $MoCl_3(THF)_3$ and the amidinate may react over a period of time, e.g., 24 hours, in a solution of diethyl ether ($Et_2O$) and THF. The $Et_2O$ and THF may have a 5:1 ratio. The reaction produces the Mo compound shown in FIG. 8 and lithium chloride (LiCl) in a 3:1 ratio (3 LiCl to 1 $MoCl_3(THF)_3$). The LiCl may be removed from the solution to isolate the intermediate Mo compound.

The intermediate compound includes four N atoms bonded to the Mo atom, one Cl atom bonded to the Mo atom, and various R and R' groups bonded to the N atoms as illustrated in FIG. 8. In this example, the R groups may be Me, Et, iPr, tBu, or secBu. The R' groups may be hydrogen (H), Me, or tBu. In a given compound, the R groups are the same, and the R' groups are the same. The R and R' groups present in the intermediate Mo compound depend on which R and R' groups are included in the initial amidinate that reacted with the $MoCl_3(THF)_3$. As noted with respect to FIG. 3, in some embodiments, an amidinate ligand has an R" group instead of one of the R groups, where R and R" are different.

After this first reaction, a second reaction is performed to remove the remaining Cl atom from the intermediate Mo compound. FIGS. 9-12 illustrate second reactions that can be performed from the intermediate Mo compound to produce four different Mo(III) precursors.

FIG. 9 illustrates a cyclopenadienyl derivative Mo(III) compound formed from the compound shown in FIG. 8, according to some embodiments of the present disclosure. The cyclopenadienyl derivative shown in FIG. 9 is produced by reacting the intermediate Mo compound shown in FIG. 8 with sodium cyclopentadienide (NaCp). The cyclopenadienyl derivative illustrated in FIG. 9 includes one Mo atom, which has a +3 oxidation state. The cyclopenadienyl derivative illustrated in FIG. 9 further includes four nitrogen atoms bonded to the Mo atom, and cyclopentadienide bonded to the Mo atom. The cyclopenadienyl derivative further include various R and R' groups bonded to the nitrogen atoms. The R and R' groups may be the same as the R and R' groups discussed with respect to the intermediate Mo compound shown in FIG. 8, and depend on which R and R' groups (and, in some cases, which R" group) are included in the initial amidinate that reacted with the $MoCl_3(THF)_3$.

Figures 10A, 10B:
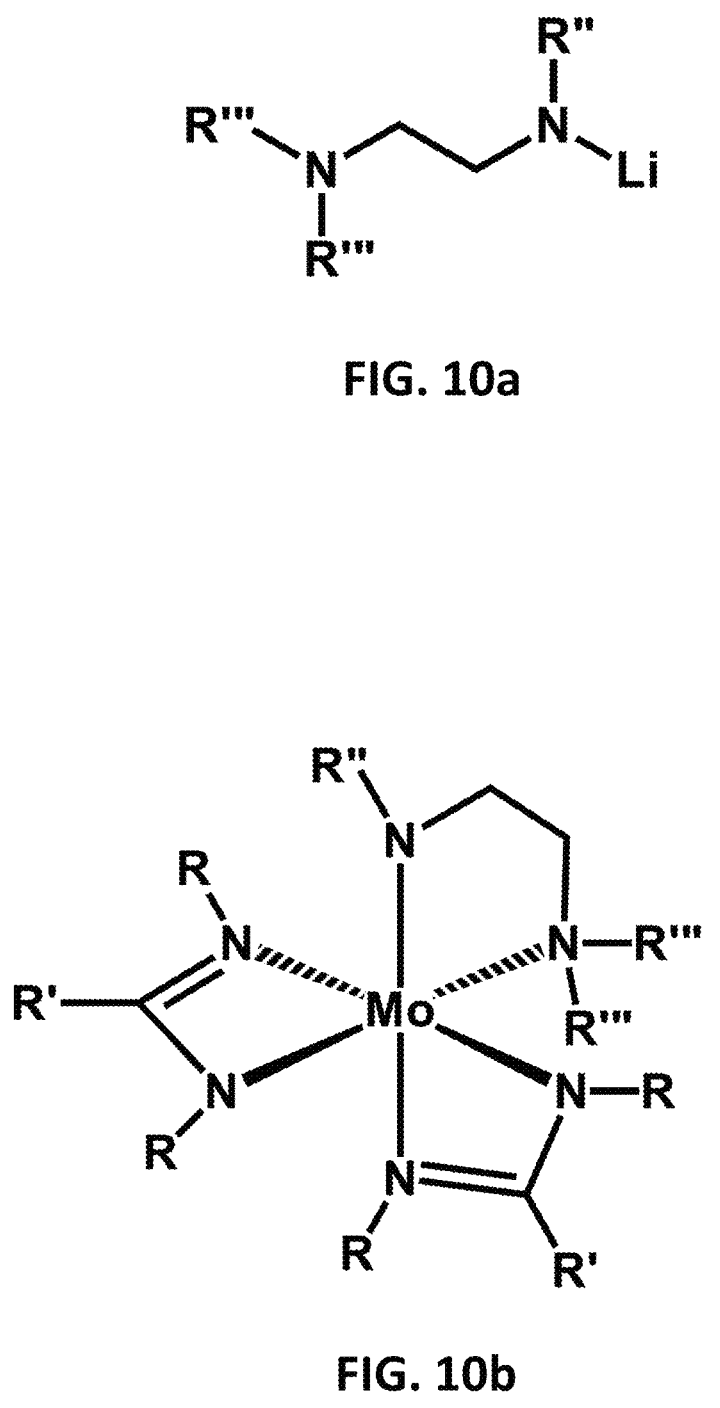

FIG. 10a illustrates a lithium aminoamide that can be reacted with the intermediate compound shown in FIG. 8 to produce an aminoamide derivative Mo(III) compound. The lithium aminoamide includes two nitrogen atoms, a lithium atom, an R" group, and two R'" groups. The R" group may be one of Me, Et, iPr, tBu, and secBu. The R'" groups may also be one of Me, Et, iPr, tBu, and secBu, with the two R'" groups being the same.

FIG. 10b illustrates an aminoamide derivative formed from the lithium aminoamide shown in FIG. 10a and the intermediate Mo compound shown in FIG. 8, according to some embodiments of the present disclosure. The aminoamide derivative includes an Mo atom in a +3 oxidation state. The Mo atom is bonded to six N atoms, which are bonded to various R, R', R", and R'" groups. The R and R' groups may be the same as the R and R' groups discussed with respect to the intermediate Mo compound shown in FIG. 8, and depend on which R and R' groups (and, in some cases, which R" group) are included in the initial amidinate that reacted with the $MoCl_3(THF)_3$. The R" group and the R'" group may be the same as the R" and R'" groups discussed with respect to the lithium aminoamide shown in FIG. 10a, and depend on which R" group and R'" groups are included in the lithium aminoamide.

Figures 11A, 11B:
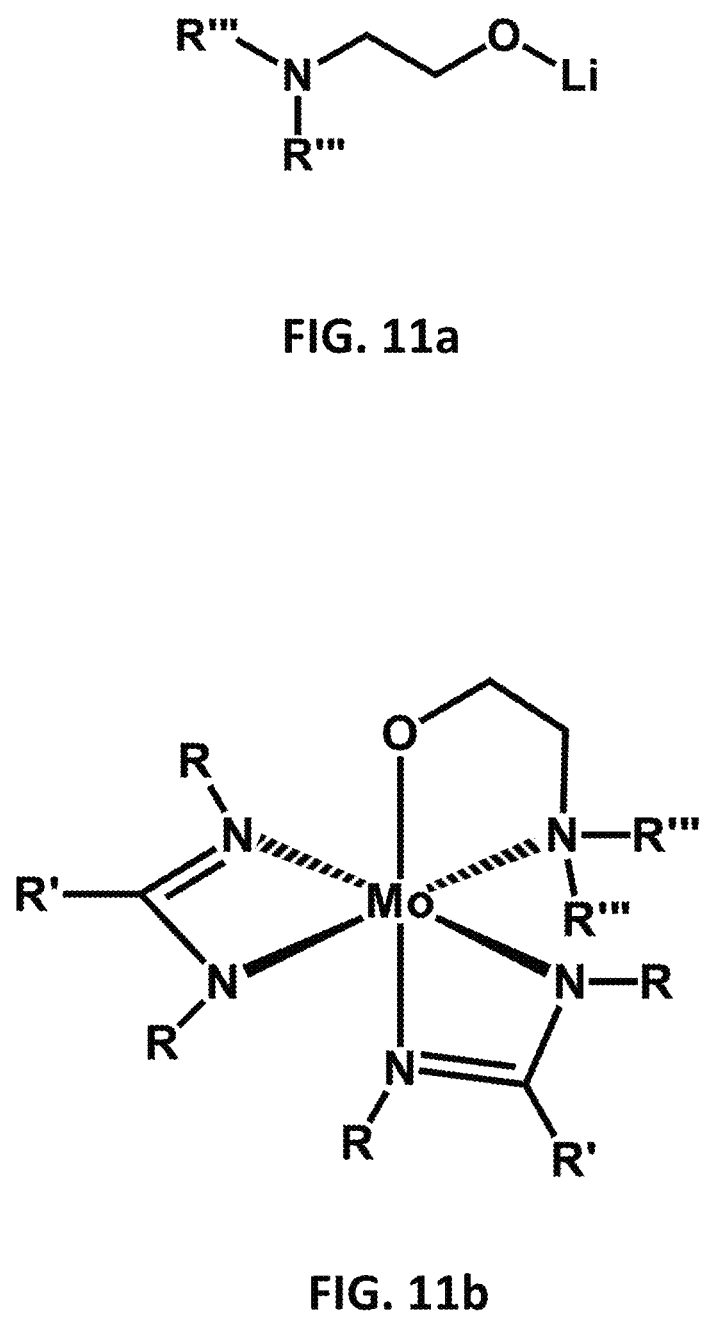

FIG. 11a illustrates a lithium aminoalkoxide that can be reacted with the intermediate compound shown in FIG. 8 to produce an aminoalkoxide derivative Mo(III) compound. The lithium aminoalkoxide includes an oxygen atom, a lithium atom, a nitrogen atom, and two R'" groups. The R'" groups may be one of Me, Et, iPr, tBu, and secBu, with the two R'" groups being the same.

FIG. 11b illustrates an aminoalkoxide derivative formed from the lithium aminoalkoxide shown in FIG. 11a and the intermediate Mo compound shown in FIG. 8, according to some embodiments of the present disclosure. The aminoalkoxide derivative includes an Mo atom in a +3 oxidation state. The Mo atom is bonded to one O atom and five N atoms, and the N atoms are bonded to various R, R', and R'" groups. The R and R' groups may be the same as the R and R' groups discussed with respect to the intermediate Mo compound shown in FIG. 8, and depend on which R and R' groups (and, in some cases, which R" group) are included in the initial amidinate that reacted with the $MoCl_3(THF)_3$. The R'" group may be the same as the R'" groups discussed with respect to the lithium aminoalkoxide shown in FIG. 11a, and depend on which R'" group is included in the lithium aminoalkoxide.

Figures 12A, 12B:
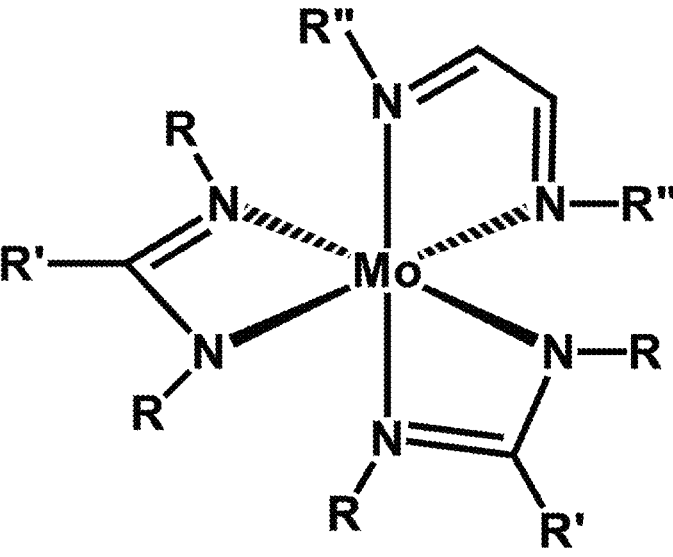
FIGS. 12a and 12b illustrate a lithium diazabutadieneide and a diazabutadiene derivative formed from the lithium diazabutadieneide and the compound shown in FIG. 8, according to some embodiments of the present disclosure.

FIG. 12a illustrates a lithium diazabutadieneide that can be reacted with the intermediate compound shown in FIG. 8 to produce an diazabutadieneide derivative Mo(III) compound. The lithium diazabutadieneide includes two nitrogen atoms, two R" groups, and a lithium atom. The R" group may be one of Me, Et, iPr, tBu, and secBu, with the two R" groups being the same.

FIG. 12b illustrates a diazabutadiene derivative formed from the lithium diazabutadieneide shown in FIG. 12a and the intermediate Mo compound shown in FIG. 8, according to some embodiments of the present disclosure. The diazabutadiene derivative includes an Mo atom in a +3 oxidation state. The Mo atom is bonded to six N atoms, which are bonded to various R, R', and R", groups. The R and R' groups may be the same as the R and R' groups discussed with respect to the intermediate Mo compound shown in FIG. 8, and depend on which R and R' groups (and, in some cases, which R" group) are included in the initial amidinate that reacted with the $MoCl_3(THF)_3$. The R" group may be the same as the R" groups discussed with respect to the lithium diazabutadieneide shown in FIG. 12a, and depend on which R" group is included in the lithium diazabutadieneide.

The Mo(III) compounds shown in FIGS. 9, 10b, 11b, and 12b may be used as a Mo precursor for depositing Mo on an IC device, e.g., as a gate electrode and/or as a S/D contact (or pair of S/D contacts) for either of the transistor structures shown in FIGS. 1 and 2. A method for depositing the Mo(III) compounds is described with respect to FIGS. 13 and 14.

Method for Depositing Molybdenum Using Mid-Valent Molybdenum Precursors

Figure 13:
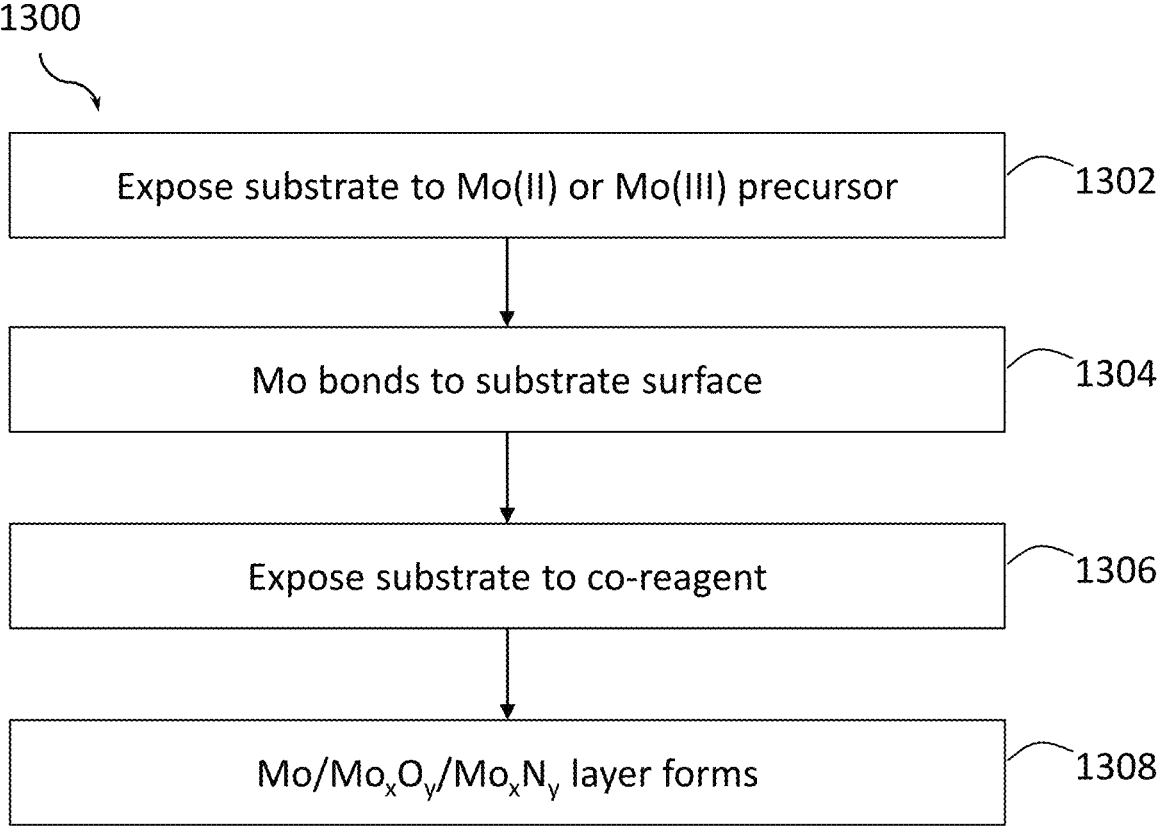
FIG. 13 illustrates a method for depositing molybdenum on a substrate using an Mo(II) or Mo(III) precursor, according to some embodiments of the present disclosure.
Figures 14A, 14B:
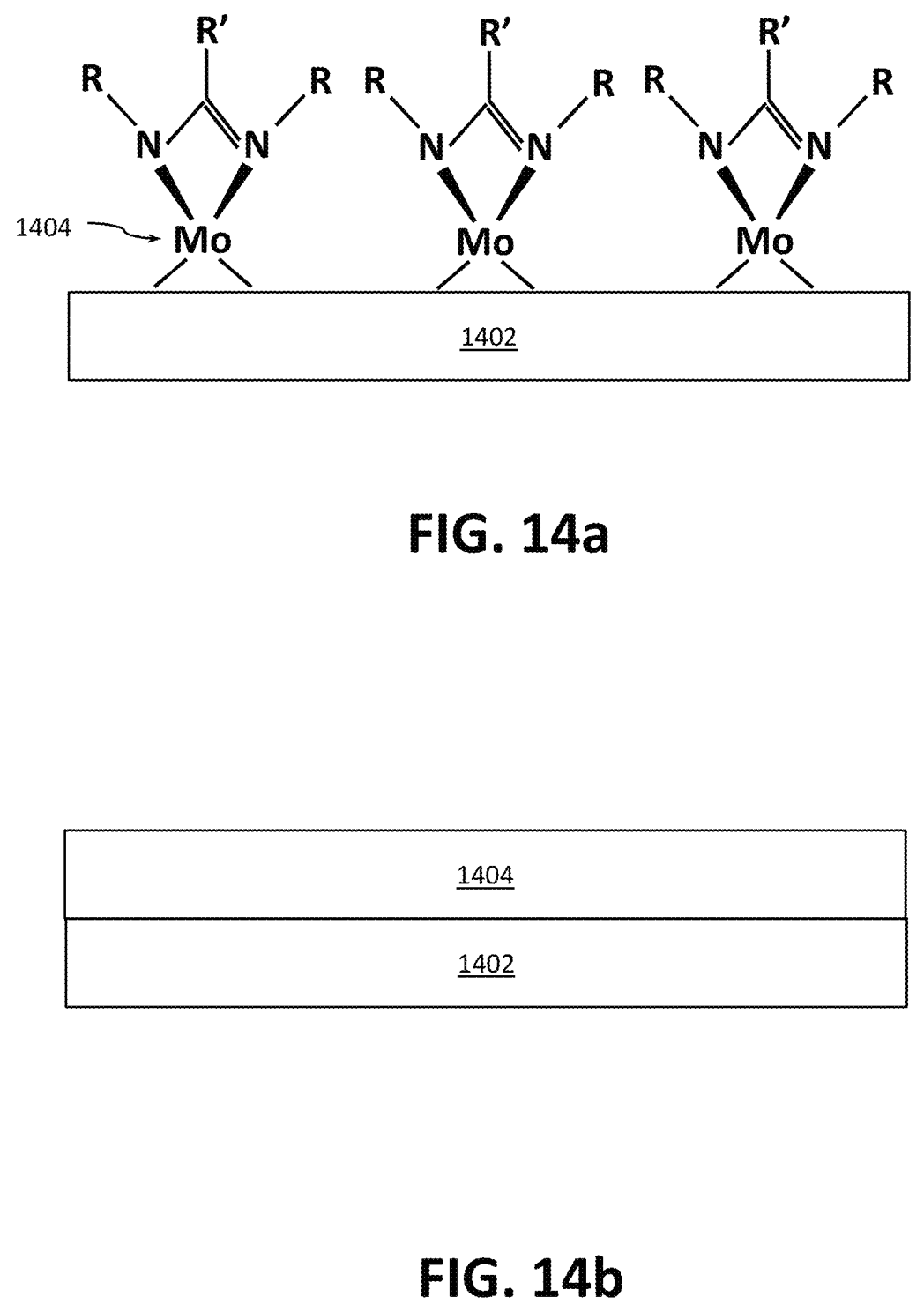

FIG. 13 illustrates a method 1300 for depositing molybdenum on a substrate using an Mo(II) or Mo(III) precursor, according to some embodiments of the present disclosure. FIGS. 14a and 14b are schematic illustrations showing steps in the deposition of Mo(II) or Mo(III) on a substrate, according to some embodiments of the present disclosure.

The method 1300 begins with exposing 1302 a substrate, such as the support structure described with respect to FIG. 1, to a Mo(II) or Mo(III) precursor. In some embodiments, the support structure includes silicon (e.g., $SiO_2$), hafnium (e.g., $HfO_2$), or Ti (e.g., TiN). Any of the Mo precursors described with respect to FIGS. 6, 7, and 9-12 may be deposited on the support structure. For example, the Mo precursor may be a Mo(II) amidinate, a Mo(III) amidinate, a Mo(III) formamidinate, or a Mo(II) amidinate-acetate. If the method 1300 is an ALD process, the chamber holding the substrate may be purged following the dosing of the substrate with the Mo precursor.

The molybdenum atoms in the Mo(II) or Mo(III) precursor bond 1304 to the substrate surface. FIG. 14a shows an example support structure 1402 with molybdenum atoms 1404 deposited over the support structure 1402. The Mo bonds to materials in the support structure, e.g., Si, Hf, or Ti. Two nitrogen atoms, two R groups, and one R' group remain bonded to the Mo atom. As discussed above, in some embodiments, an R" group may replace one of the R groups, where R and R" are different. As illustrated in FIG. 14a, the Mo atoms may form a Mo layer across the surface of the substrate 14a.

The method 1300 proceeds with exposing 1306 the substrate to a co-reagent. The co-reagent can remove the various R groups from the deposited material, and, if desired, can remove the nitrogen from the deposited material. Various different co-reagents may be used, depending on the form of the deposited Mo. For example, to produce a layer of Mo⁰, the co-reagent may be dihydrogen ($H_2$) or dihydrogen plasma. To produce a layer of a molybdenum and oxygen compound ($Mo_xO_y$), the co-reagent may be one of water ($H_2O$), hydrogen peroxide ($H_2O_2$), dioxygen ($O_2$) or dioxygen plasma, ozone ($O_3$), a nitrogen oxide ($NO_x$), or nitrous oxide ($N_2O$). To produce a layer of a molybdenum and nitrogen compound ($Mo_xN_y$), the co-reagent may be one of ammonia ($NH_3$), ammonia plasma, hydrazine ($N_2H_4$), tert-butyl (tBu) $N_2H_4$ hydrazine, methyl-hydrazine ($MeN_2H_3$), or dinitrogen plasma ($N_2$ plasma). If the method 1300 is an ALD process, the chamber holding the substrate may be purged following the dosing of the substrate with the co-reagent.

By exposing the substrate to the Mo(II) or Mo(III) precursor followed by the co-reagent, a molybdenum layer forms 1308 over the substrate 1302. The molybdenum layer may be made up of Mo⁰, $Mo_xO_y$, or $Mo_xN_y$, depending on the co-reagent. FIG. 14b illustrates the substrate 1402 with a molybdenum layer 1404 (e.g., Mo⁰, $Mo_xO_y$, or $Mo_xN_y$) formed as a layer over the substrate 1402. The steps 1302-1308 may be repeated to generate additional layers of the Mo material over the substrate 1402. For example, the steps 1302-1308 may be repeated for a certain number of cycles to obtain a desired film thickness.

In some embodiments, a chemical vapor deposition (CVD) process may be used to deposit one or more Mo layers, rather than the ALD process described above. In a CVD process, at step 1306, a Mo(II) or Mo(III) precursor may be introduced to the chamber along with the co-reagent, so that the co-reagent and Mo precursor react to form one or more layers over the initial layer. The Mo precursor deposited with the co-reagent may be the same or different from the Mo(II) or Mo(III) precursor used in process 1302. In a CVD process, the purging steps may not be performed.

Example Electronic Devices

Molybdenum deposited using one of the mid-valent Mo precursors described herein may be included in any suitable electronic device. FIGS. 15-18 illustrate various examples of devices and components that may include molybdenum deposited using one of the precursors described herein.

Figure 15A:
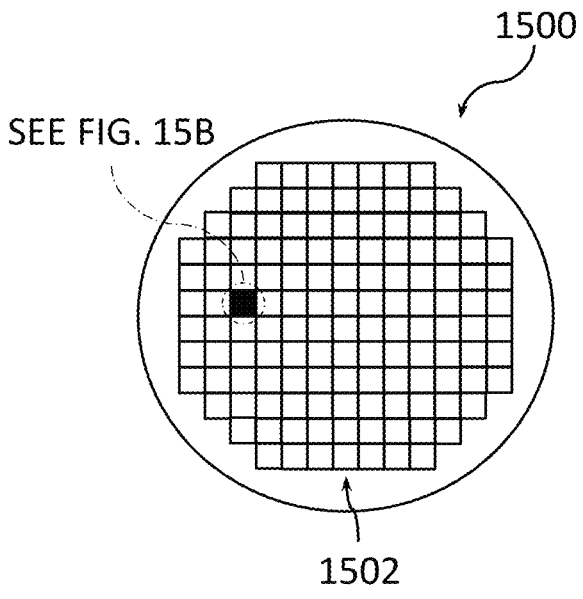
FIGS. 15A and 15B are top views of, respectively, a wafer and dies that may include molybdenum deposited using one of the precursors described herein, in accordance with any of the embodiments disclosed herein.
Figure 15B:
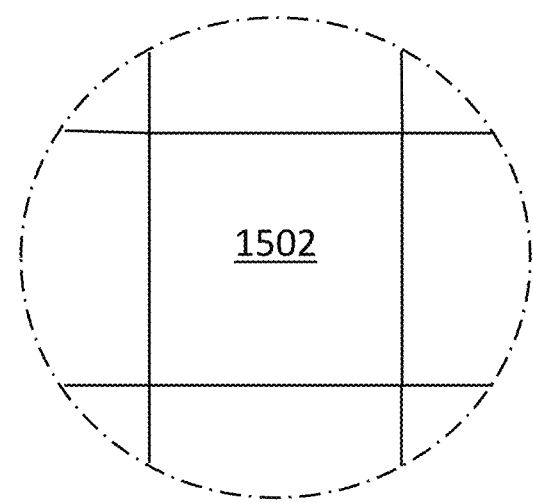

FIGS. 15A and 15B are top views of a wafer and dies that include one or more IC structures with devices including molybdenum deposited in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC structure (e.g., the IC structures as shown in any of FIG. 1, 2, or 4-6, or any further embodiments of the IC structures described herein). After the fabrication of the semiconductor product is complete (e.g., after manufacture of one or more IC structures with one or more devices including molybdenum deposited as described herein, included in a particular electronic component, e.g., in a transistor or in a memory device), the wafer 1500 may undergo a singulation process in which each of the dies 1502 is separated from one another to provide discrete "chips" of the semiconductor product. In particular, devices that include one or more devices that include molybdenum deposited as disclosed herein may take the form of the wafer 1500 (e.g., not singulated) or the form of the die 1502 (e.g., singulated). The die 1502 may include one or more transistors (e.g., one or more of the transistors 1640 of FIG. 16, discussed below) and/or supporting circuitry to route electrical signals to the transistors, as well as any other IC components (e.g., one or more devices that include molybdenum). In some embodiments, the wafer 1500 or the die 1502 may include a memory device (e.g., an SRAM device), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 18) or other logic that is configured to store information in the memory devices or execute instructions stored in the memory array.

Figure 16:
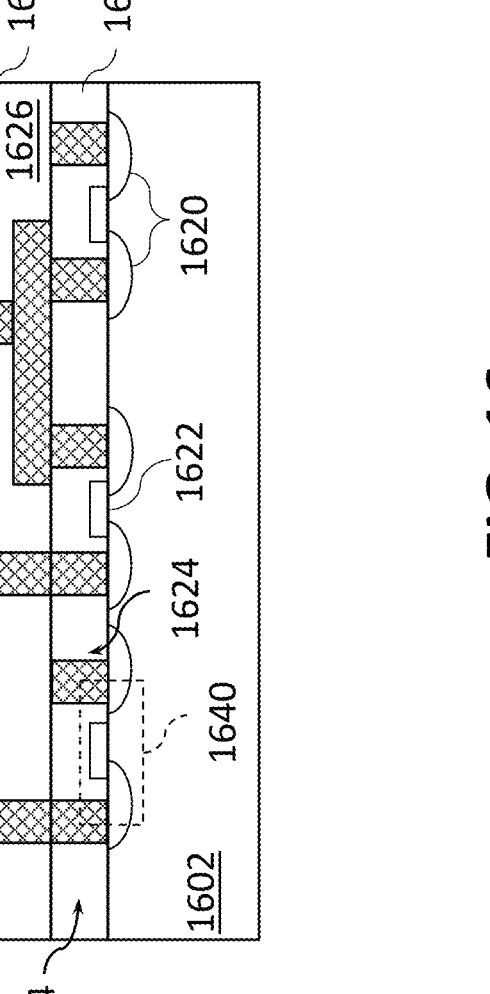
FIG. 16 is a cross-sectional side view of an integrated circuit (IC) package that may include molybdenum deposited using one of the precursors described herein, in accordance with any of the embodiments disclosed herein.

FIG. 16 is a cross-sectional side view of an IC device 1600 that may include one or more devices including molybdenum deposited in accordance with any of the embodiments disclosed herein. The IC device 1600 may be formed on a substrate 1602 (e.g., the wafer 1500 of FIG. 15A) and may be included in a die (e.g., the die 1502 of FIG. 15B). The substrate 1602 may be any substrate as described herein. The substrate 1602 may be part of a singulated die (e.g., the dies 1502 of FIG. 15B) or a wafer (e.g., the wafer 1500 of FIG. 15A).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 16 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate electrode layer and a gate dielectric layer.

The gate electrode layer may be formed on the gate interconnect support layer and may consist of at least one P-type workfunction metal or N-type workfunction metal, depending on whether the transistor is to be a PMOS or an NMOS transistor, respectively. In some implementations, the gate electrode layer may consist of a stack of two or more metal layers, where one or more metal layers are workfunction metal layers and at least one metal layer is a fill metal layer. Further metal layers may be included for other purposes, such as a barrier layer or/and an adhesion layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 electron Volts (eV) and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, aluminum carbide, tungsten, tungsten carbide. An N-type metal layer will enable the formation of an NMOS gate electrode with a workfunction that is between about 3.9 eV and about 4.2 eV.

In some embodiments, when viewed as a cross-section of the transistor 1640 along the source-channel-drain direction, the gate electrode may be formed as a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may be implemented as a combination of U-shaped structures and planar, non-U-shaped structures. For example, the gate electrode may be implemented as one or more U-shaped metal layers formed atop one or more planar, non-U-shaped layers. In some embodiments, the gate electrode may consist of a V-shaped structure (e.g., when a fin of a FinFET transistor does not have a "flat" upper surface, but instead has a rounded peak).

Generally, the gate dielectric layer of a transistor 1640 may include one layer or a stack of layers, and the one or more layers may include silicon oxide, silicon dioxide, and/or a high-k dielectric material. The high-k dielectric material included in the gate dielectric layer of the transistor 1640 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The S/D regions 1620 may be formed within the substrate 1602 adjacent to the gate 1622 of each transistor 1640, using any suitable processes known in the art. For example, the S/D regions 1620 may be formed using either an implantation/diffusion process or a deposition process. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion implantation process. In the latter process, an epitaxial deposition process may provide material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620. In some embodiments, an etch process may be performed before the epitaxial deposition to create recesses in the substrate 1602 in which the material for the S/D regions 1620 is deposited.

Electrical signals, such as power and/or input/output (I/O) signals, may be routed to and/or from the transistors 1640 of the device layer 1604 through one or more interconnect layers disposed on the device layer 1604 (illustrated in FIG. 16 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form an ILD stack 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 16). Although a particular number of interconnect layers 1606-1610 is depicted in FIG. 16, embodiments of the present disclosure include IC devices having more or fewer interconnect layers than depicted.

In some embodiments, the interconnect structures 1628 may include trench contact structures 1628a (sometimes referred to as "lines") and/or via structures 1628b (sometimes referred to as "holes") filled with an electrically conductive material such as a metal. The trench contact structures 1628a may be arranged to route electrical signals in a direction of a plane that is substantially parallel with a surface of the substrate 1602 upon which the device layer 1604 is formed. For example, the trench contact structures 1628a may route electrical signals in a direction in and out of the page from the perspective of FIG. 16. The via structures 1628b may be arranged to route electrical signals in a direction of a plane that is substantially perpendicular to the surface of the substrate 1602 upon which the device layer 1604 is formed. In some embodiments, the via structures 1628b may electrically couple trench contact structures 1628a of different interconnect layers 1606-1610 together.

The interconnect layers 1606-1610 may include a dielectric material 1626 disposed between the interconnect structures 1628, as shown in FIG. 16. The dielectric material 1626 may take the form of any of the embodiments of the dielectric material provided between the interconnects of the IC structures disclosed herein.

In some embodiments, the dielectric material 1626 disposed between the interconnect structures 1628 in different ones of the interconnect layers 1606-1610 may have different compositions. In other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include trench contact structures 1628a and/or via structures 1628b, as shown. The trench contact structures 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include via structures 1628b to couple the trench contact structures 1628a of the second interconnect layer 1608 with the trench contact structures 1628*a* of the first interconnect layer 1606. Although the trench contact structures 1628*a* and the via structures 1628*b* are structurally delineated with a line within each interconnect layer (e.g., within the second interconnect layer 1608) for the sake of clarity, the trench contact structures 1628*a* and the via structures 1628*b* may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606.

The IC device 1600 may include a solder resist material 1634 (e.g., polyimide or similar material) and one or more bond pads 1636 formed on the interconnect layers 1606-1610. The bond pads 1636 may be electrically coupled with the interconnect structures 1628 and configured to route the electrical signals of the transistor(s) 1640 to other external devices. For example, solder bonds may be formed on the one or more bond pads 1636 to mechanically and/or electrically couple a chip including the IC device 1600 with another component (e.g., a circuit board). The IC device 1600 may have other alternative configurations to route the electrical signals from the interconnect layers 1606-1610 than depicted in other embodiments. For example, the bond pads 1636 may be replaced by or may further include other analogous features (e.g., posts) that route the electrical signals to external components.

Figure 17:
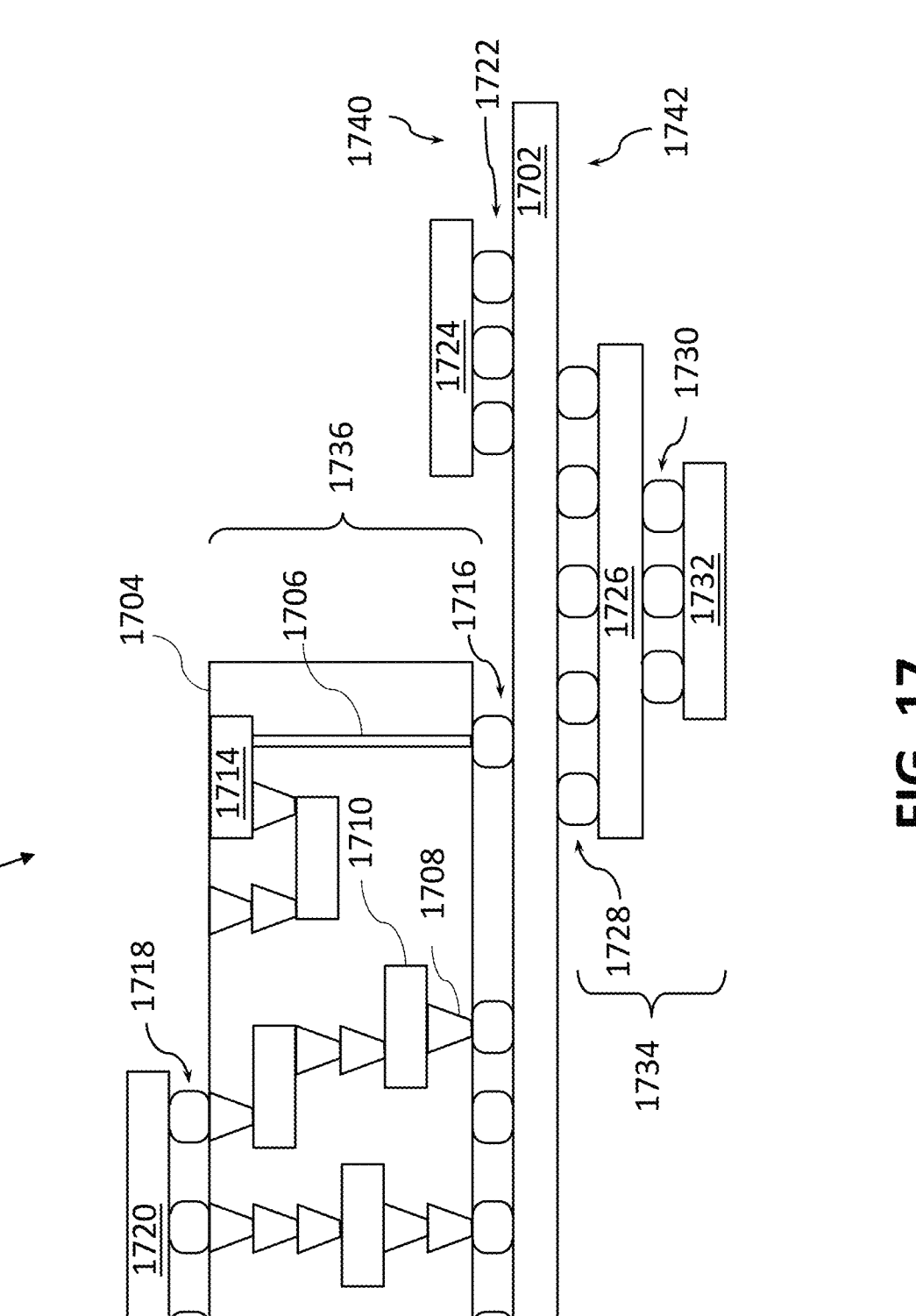
FIG. 17 is a cross-sectional side view of an IC device assembly that may include molybdenum deposited using one of the precursors described herein, in accordance with any of the embodiments disclosed herein.

FIG. 17 is a cross-sectional side view of an IC device assembly 1700 that may include components having or being associated with (e.g., being electrically connected by means of) one or more devices including molybdenum deposited in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. In particular, any suitable ones of the components of the IC device assembly 1700 may include any of the molybdenum materials deposited as disclosed herein.

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 17 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 17), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 17, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 15B), an IC device (e.g., the IC device 1600 of FIG. 16), or any other suitable component. In some embodiments, the IC package 1720 may include devices including molybdenum, as described herein. Generally, the interposer 1704 may spread a connection to a wider pitch or reroute a connection to a different connection. For example, the interposer 1704 may couple the IC package 1720 (e.g., a die) to a ball grid array (BGA) of the coupling components 1716 for coupling to the circuit board 1702. In the embodiment illustrated in FIG. 17, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, a ceramic material, or a polymer material such as polyimide. In some implementations, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to TSVs 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 17 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 18:
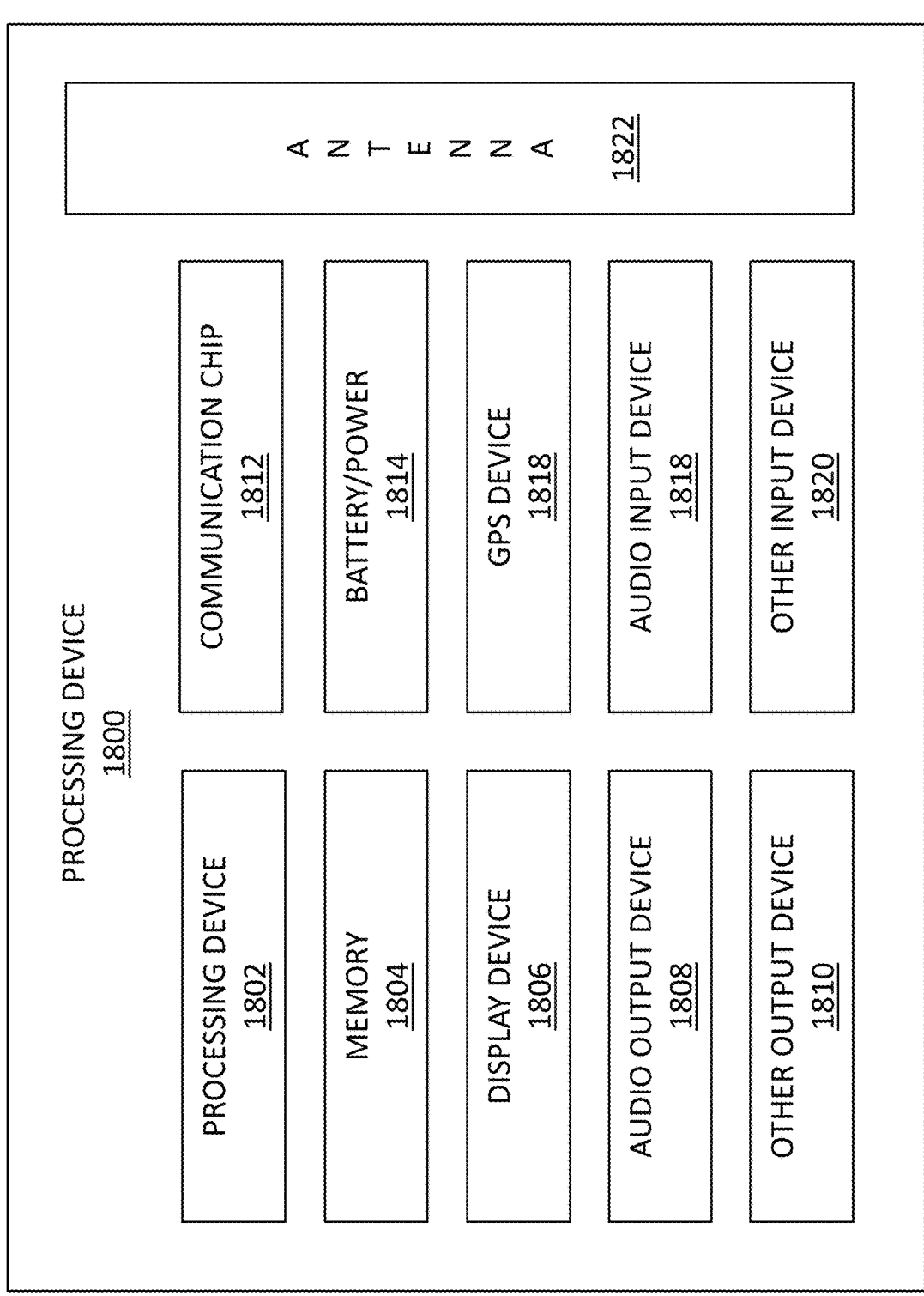
FIG. 18 is a block diagram of an example computing device that may include molybdenum deposited using one of the precursors described herein, in accordance with any of the embodiments disclosed herein.

FIG. 18 is a block diagram of an example computing device 1800 that may include one or more components including one or more devices including molybdenum in accordance with any of the embodiments disclosed herein. For example, any suitable ones of the components of the computing device 1800 may include a die (e.g., the die 1502 of FIG. 15B) having devices including molybdenum deposited as described herein. Any one or more of the components of the computing device 1800 may include, or be included in, an IC device 1600 (FIG. 16). Any one or more of the components of the computing device 1800 may include, or be included in, an IC device assembly 1700 (FIG. 17).

A number of components are illustrated in FIG. 18 as included in the computing device 1800, but any one or more of these components may be omitted or duplicated, as suitable for the application. In some embodiments, some or all of the components included in the computing device 1800 may be attached to one or more motherboards. In some embodiments, some or all of these components are fabricated onto a single system-on-a-chip (SoC) die.

Additionally, in various embodiments, the computing device 1800 may not include one or more of the components illustrated in FIG. 18, but the computing device 1800 may include interface circuitry for coupling to the one or more components. For example, the computing device 1800 may not include a display device 1806, but may include display device interface circuitry (e.g., a connector and driver circuitry) to which a display device 1806 may be coupled. In another set of examples, the computing device 1800 may not include an audio input device 1824 or an audio output device 1808 but may include audio input or output device interface circuitry (e.g., connectors and supporting circuitry) to which an audio input device 1824 or audio output device 1808 may be coupled.

The computing device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 1800 may include a memory 1804, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random-access memory (eDRAM) or spin transfer torque magnetic random-access memory (STT-MRAM).

In some embodiments, the computing device 1800 may include a communication chip 1812 (e.g., one or more communication chips). For example, the communication chip 1812 may be configured for managing wireless communications for the transfer of data to and from the computing device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The computing device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The computing device 1800 may include battery/power circuitry 1814. The battery/power circuitry 1814 may include one or more energy storage devices (e.g., batteries or capacitors) and/or circuitry for coupling components of the computing device 1800 to an energy source separate from the computing device 1800 (e.g., AC line power).

The computing device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display, for example.

The computing device 1800 may include an audio output device 1808 (or corresponding interface circuitry, as discussed above). The audio output device 1808 may include any device that generates an audible indicator, such as speakers, headsets, or earbuds, for example.

The computing device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The computing device 1800 may include a GPS device 1818 (or corresponding interface circuitry, as discussed above). The GPS device 1818 may be in communication with a satellite-based system and may receive a location of the computing device 1800, as known in the art.

The computing device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The computing device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1800 may have any desired form factor, such as a hand-held or mobile computing device (e.g., a cell phone, a smart phone, a mobile internet device, a music player, a tablet computer, a laptop computer, a net-book computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1800 may be any other electronic device that processes data.

SELECT EXAMPLES

The following paragraphs provide various examples of the embodiments disclosed herein.

Example 1 provides a molybdenum (Mo) (III) compound including one Mo atom in a +3 oxidation state; and at least four nitrogen (N) atoms bonded to the Mo atom.

Example 2 provides the Mo(III) compound of example 1, including six N atoms bonded to the Mo atom.

Example 3 provides the Mo(III) compound of example 1, further including cyclopentadienide bonded to the Mo atom.

Example 4 provides the Mo(III) compound of example 1, including five N atoms and an oxygen (O) atom bonded to the Mo atom.

Example 5 provides the Mo(III) compound of any of examples 1-4, further including at least one of a methyl group (Me), an ethyl group (Et), an isopropyl group (iPr), a tert-butyl group (tBu), and a sec-butyl group (secBu).

Example 6 provides the Mo(III) compound of example 5, further including at least one of hydrogen (H), Me, and tBu.

Example 7 provides the Mo(III) compound of example 6, further including at least one of Me, Et, iPr, tBu, and secBu.

Example 8 provides a molybdenum (Mo) (II) compound including a first Mo atom in a +2 oxidation state; a second Mo atom in a +2 oxidation state, the second Mo atom bonded to the first Mo atom; at least two nitrogen (N) atoms bonded to the first Mo atom; and at least two N atoms bonded to the second Mo atom.

Example 9 provides the Mo(II) compound of example 8, further including two oxygen (O) atoms bonded to the first Mo atom; and two O atoms bonded to the second Mo atom.

Example 10 provides the Mo(II) compound of example 8, further including a third N atom and an oxygen (O) atom bonded to the first Mo atom; and a third N atom and an O atom bonded to the second Mo atom.

Example 11 provides the Mo(II) compound of example 8 including four N atoms bonded to the first Mo atom; and four N atoms bonded to the second Mo atom.

Example 12 provides a method for depositing molybdenum (Mo) including exposing a surface of a substrate to a first Mo precursor, the first Mo precursor including Mo(II) or Mo(III); and exposing the surface of the substrate to a co-reagent.

Example 13 provides the method of example 12, further comprising exposing the surface of the substrate to a second Mo precursor along with the co-reagent, where the first Mo precursor is different from the second Mo precursor.

Example 14 provides the method of example 12, further comprising exposing the surface of the substrate to a second Mo precursor along with the co-reagent, where the first Mo precursor is the same as the second Mo precursor.

Example 15 provides the method of any of examples 12-14, where the first Mo precursor is an Mo(III) amidinate.

Example 16 provides the method of any of examples 12-14, where the first Mo precursor is an Mo(III) formamidinate.

Example 17 provides the method of any of examples 12-14, where the first Mo precursor is an Mo(II) amidinate or an Mo(II) amidinate-acetate.

Example 18 provides the method of any of examples 12-17, where the co-reagent includes water ($H_2O$), hydrogen peroxide ($H_2O_2$), dioxygen ($O_2$), dioxygen plasma, ozone ($O_3$), a nitrogen oxide ($NO_x$), or nitrous oxide ($N_2O$), and the Mo precursor and the co-reagent form a compound including Mo and oxygen (O).

Example 19 provides the method of any of examples 12-17, where the co-reagent includes ammonia ($NH_3$), ammonia plasma, hydrazine ($N_2H_4$), tert-butyl (tBu) $N_2H_4$ hydrazine, methyl-hydrazine ($MeN_2H_3$), dinitrogen ($N_2$), or dinitrogen plasma, and the Mo precursor and the co-reagent form a compound including Mo and nitrogen (N).

Example 20 provides the method of any of examples 12-17, where the co-reagent includes dihydrogen ($H_2$) or dihydrogen plasma, and the Mo precursor and the co-reagent form metal Mo.

Example 21 provides a method for producing a mid-valent molybdenum (Mo) compound including reacting a first Mo compound with a ligand in a solution, the first Mo compound including chlorine (Cl) or acetate (OAc), the ligand including an amidinate or a formamidinate; and removing a lithium compound from the solution to isolate the mid-valent Mo compound.

Example 22 provides the method of example 21, where the first Mo compound includes an Mo atom bonded to three Cl atoms and three oxygen (O) atoms.

Example 23 provides the method of example 22, where the mid-valent Mo compound includes Mo in a +3 oxidation state.

Example 24 provides the method of example 21, where the first Mo compound includes Mo acetate (Mo2(OAc)4).

Example 25 provides the method of example 24, where the mid-valent Mo compound includes Mo in a +2 oxidation state.

Example 26 provides the method of examples 21-25, where the ligand includes two nitrogen (N) atoms, a lithium atom (Li), and at least one of a methyl group (Me), an ethyl group (Et), an isopropyl group (iPr), a tert-butyl group (tBu), or a sec-butyl group (secBu).

Example 27 provides the method of any of examples 21-26, where a 3:1 ratio of ligand to Mo compound is used in the reaction.

Example 28 provides the method of any of examples 21-27, where the solution includes diethyl ether (Et2O) and tetrahydrofuran (THF) in a 5:1 ratio.

Example 29 provides the method of any of examples 21-26, where reacting the first Mo compound with the ligand produces a second Mo compound including Cl, the method further including reacting the second Mo compound with a second ligand to remove the Cl from the second Mo compound.

Example 30 provides the method of example 29, where the second ligand includes one of sodium cyclopentadienide (NaCp), diazabutadiene, aminoamide, and aminoalkoxide.

Example 31 provides an IC device including a substrate; and a layer of high-density molybdenum (Mo) deposited over the substrate, where at least half of the atoms in the Mo layer are Mo.

Example 32 provides the IC device of example 31, further including a semiconductor nanoribbon extending in a direction substantially parallel to the substrate, where the layer of high-density Mo at least partially surrounds the semiconductor nanoribbon.

Example 33 provides the IC device of example 32, where the semiconductor nanoribbon is a first semiconductor nanoribbon, the IC device further including a second semiconductor nanoribbon stacked over the first semiconductor nanoribbon, and the layer of high-density Mo is between the first semiconductor nanoribbon and the second semiconductor nanoribbon.

Example 34 provides the IC device of example 32 or 23, where the semiconductor nanoribbon forms a channel of a transistor, and the layer of high-density Mo forms a gate of the transistor.

Example 35 provides the IC device of any of examples 32 through 34, where the high-density Mo layer further includes oxygen.

Example 36 provides the IC device of any of examples 32 through 34, where the high-density Mo layer further includes nitrogen.

Example 37 provides the IC device of example 31, where the layer of high-density Mo forms at least one source/drain (S/D) contact for a transistor.

Example 38 provides the IC device of any of examples 31 to 37, where the substrate includes silicon or hafnium.

Example 39 provides the IC device of example 38, where the substrate further includes oxygen.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device comprising:
   a substrate;
   a first layer of high-density molybdenum (Mo) deposited over the substrate, wherein at least 60% of atoms in the Mo first layer are Mo; and
   a second layer of high-density Mo deposited over the first layer, wherein at least 60% of atoms in the second layer are Mo.

2. The IC device of claim 1, further comprising a semiconductor nanoribbon extending in a direction substantially parallel to the substrate, wherein the first layer of high-density Mo at least partially surrounds the semiconductor nanoribbon.

3. The IC device of claim 2, wherein the semiconductor nanoribbon is a first semiconductor nanoribbon, the IC device further comprising a second semiconductor nanoribbon stacked over the first semiconductor nanoribbon, and the first layer and the second layer of high-density Mo are between the first semiconductor nanoribbon and the second semiconductor nanoribbon.

4. The IC device of claim 2, wherein the semiconductor nanoribbon forms a channel of a transistor, and the layer of high-density Mo forms a gate of the transistor.

5. The IC device of claim 1, wherein the high-density Mo layer further comprises oxygen.

6. The IC device of claim 1, wherein the high-density Mo layer further comprises nitrogen.

7. The IC device of claim 1, wherein the layer of high-density Mo forms at least one source/drain (S/D) contact for a transistor.

8. The IC device of claim 1, wherein the substrate comprises silicon or hafnium.

9. The IC device of claim 8, wherein the substrate further comprises oxygen.

10. An integrated circuit (IC) device comprising:
    a channel material; and
    a high-density molybdenum (Mo) material deposited over the channel material, wherein, in a first atomic layer of the high-density Mo material nearest to the channel material, at least 60% of atoms in the layer are Mo, and in a second atomic layer over the first atomic layer, at least 60% of atoms are Mo.

11. The IC device of claim 10, wherein the channel material comprises silicon.

12. The IC device of claim 10, further comprising a gate dielectric between the channel material and the high-density Mo material, wherein the first atomic layer of the high-density Mo material is directly over the gate dielectric.

13. The IC device of claim 10, wherein the high-density Mo material further comprises oxygen.

14. The IC device of claim 10, wherein the high-density Mo material further comprises nitrogen.

15. A device comprising:
    a semiconductor structure; and
    a conductive structure coupled to the semiconductor structure, wherein, in a portion first layer of the conductive structure directly over the semiconductor structure, at least 60% of atoms are molybdenum, and in a second layer of the conductive structure over the first layer, at least 60% of atoms are molybdenum.

16. The device of claim 15, wherein the semiconductor structure is a nanoribbon.

17. The device of claim 15, wherein the conductive structure is a source or drain contact.

18. The device of claim 15, wherein the conductive structure is a gate electrode.

19. The device of claim 15, wherein the first layer is a first atomic layer, and the second layer is a second atomic layer.

20. The device of claim 19, wherein the first atomic layer and the second atomic layer are deposited by atomic layer deposition (ALD).

* * * * *